United States Patent
Nagasawa et al.

(10) Patent No.: US 11,852,974 B2
(45) Date of Patent: Dec. 26, 2023

(54) CONDUCTIVE POLYMER COMPOSITION, COATED PRODUCT AND PATTERNING PROCESS

(71) Applicant: SHIN-ETSU CHEMICAL CO., LTD., Tokyo (JP)

(72) Inventors: Takayuki Nagasawa, Joetsu (JP); Keiichi Masunaga, Joetsu (JP); Masaaki Kotake, Joetsu (JP); Satoshi Watanabe, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 636 days.

(21) Appl. No.: 16/801,357

(22) Filed: Feb. 26, 2020

(65) Prior Publication Data
US 2020/0292941 A1 Sep. 17, 2020

(30) Foreign Application Priority Data
Mar. 11, 2019 (JP) .................................. 2019-43968

(51) Int. Cl.
| | |
|---|---|
| G03F 7/11 | (2006.01) |
| C08G 73/02 | (2006.01) |
| C08K 5/098 | (2006.01) |
| C08K 5/09 | (2006.01) |
| C09D 179/02 | (2006.01) |
| G03F 7/20 | (2006.01) |
| G03F 7/32 | (2006.01) |
| C08K 5/19 | (2006.01) |
| C09D 5/24 | (2006.01) |

(52) U.S. Cl.
CPC ............ *G03F 7/11* (2013.01); *C08G 73/0266* (2013.01); *C08K 5/098* (2013.01); *C08K 5/19* (2013.01); *C09D 5/24* (2013.01); *C09D 179/02* (2013.01); *G03F 7/20* (2013.01); *G03F 7/327* (2013.01)

(58) Field of Classification Search
CPC ... G03F 7/11; G03F 7/20; G03F 7/327; G03F 7/2059; G03F 7/093; G03F 7/0392; G03F 7/2012; G03F 7/322; C08G 73/0266; C08K 5/098; C08K 5/19; C09D 5/24; C09D 179/02; C09D 7/63; C09D 11/03; C09D 11/102; C09D 11/52; C08L 79/02; H01B 1/124
See application file for complete search history.

(56) References Cited

U.S. PATENT DOCUMENTS

| | | | |
|---|---|---|---|
| 5,370,825 A | 12/1994 | Angelopoulos et al. | |
| 5,589,270 A | 12/1996 | Murai et al. | |
| 5,776,659 A | 7/1998 | Watanabe et al. | |
| 5,891,970 A * | 4/1999 | Chen ................... | C08G 73/0266 528/391 |
| 2002/0014617 A1 | 2/2002 | Angelopoulos et al. | |
| 2010/0009299 A1* | 1/2010 | Watanabe ............. | G03F 7/0382 430/326 |
| 2010/0021843 A1* | 1/2010 | Fedynyshyn ......... | G03F 7/0757 430/296 |
| 2010/0078598 A1* | 4/2010 | Lee ....................... | C08K 5/0008 252/501.1 |

(Continued)

FOREIGN PATENT DOCUMENTS

| | | |
|---|---|---|
| EP | 2700676 A1 | 2/2014 |
| EP | 3050932 A1 | 8/2016 |

(Continued)

OTHER PUBLICATIONS

Aug. 11, 2020 Extended European Search Report in European Patent Application No. 20160215.8.

(Continued)

*Primary Examiner* — Mark F. Huff
*Assistant Examiner* — Alexander Nicholas Lee
(74) *Attorney, Agent, or Firm* — Oliff PLC

(57) ABSTRACT

An object of the present invention is to provide a conductive polymer composition which has good filterability and good film formability of a flat film on an electron beam resist and can be suitably used for an antistatic film for electron beam resist writing, showing excellent antistatic property in the electron beam writing process due to the property of low volume resistivity (Ω·cm), and, reducing an effect on lithography by making an effect of an acid diffused from the film minimum, and further having excellent peelability by $H_2O$ or an alkaline developer after writing.

A conductive polymer composition which comprises (A) a polyaniline-based conductive polymer having at least one kind or more of a repeating unit represented by the following general formula (1), and (B) a carboxylic acid salt represented by the following general formula (2):

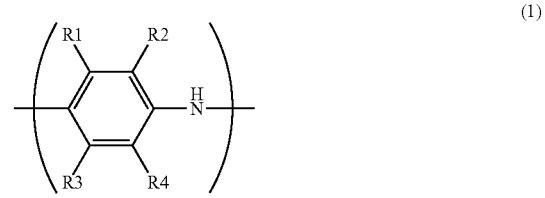

(1)

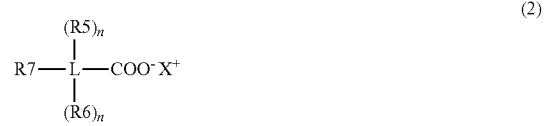

(2)

11 Claims, No Drawings

(56) References Cited

U.S. PATENT DOCUMENTS

| | | | | |
|---|---|---|---|---|
| 2012/0263883 A1* | 10/2012 | Kitayama | ................ | C09D 7/63 |
| | | | | 562/36 |
| 2014/0043731 A1* | 2/2014 | Yamada | ............. | C08G 73/0266 |
| | | | | 252/62.2 |
| 2015/0140492 A1 | 5/2015 | Sawai et al. | | |
| 2016/0078978 A1 | 3/2016 | Yamada et al. | | |
| 2016/0223909 A1* | 8/2016 | Nagasawa | ............. | C07C 227/08 |
| 2016/0223910 A1 | 8/2016 | Fukuda et al. | | |
| 2017/0042038 A1* | 2/2017 | Hamaguchi | ............ | H05K 3/105 |

FOREIGN PATENT DOCUMENTS

| | | | |
|---|---|---|---|
| JP | H07-196791 A | 8/1995 | |
| JP | H07-324132 A | 12/1995 | |
| JP | H08-109351 A | 4/1996 | |
| JP | 2902727 B2 | 6/1999 | |
| JP | 2959968 B2 | 10/1999 | |
| JP | 2000-043201 A | 2/2000 | |
| JP | 3154460 B2 | 4/2001 | |
| JP | 3631910 B2 | 3/2005 | |
| JP | 2014-009342 A | 1/2014 | |
| JP | 2016-080964 A | 5/2016 | |
| JP | 2017-039927 A | 2/2017 | |
| TW | 201248651 A | 12/2012 | |
| TW | 201418436 A | 5/2014 | |
| WO | WO-2006043448 A1 * | 4/2006 | ............ B32B 27/00 |
| WO | 2012/144608 A1 | 10/2012 | |
| WO | 2015/060231 A1 | 4/2015 | |
| WO | 2018/084637 A1 | 5/2018 | |

OTHER PUBLICATIONS

Jan. 4, 2022 Office Action issued in Japanese Patent Application No. 2019-043968.

Jan. 12, 2023 Office Action issued in Taiwanese Patent Application No. 109107783.

Apr. 27, 2023 Notice of Reasons for Revocation of a Patent issued in Opposition No. 2023-700087 against Japanese Patent No. 7108565 (Application No. 2019-043968).

Oct. 4, 2023 Notice of Reasons for Revocation of a Patent issued in Opposition No. 2023-700087 against Japanese Patent No. 7108565 (Application No. 2019-043968).

* cited by examiner

CONDUCTIVE POLYMER COMPOSITION, COATED PRODUCT AND PATTERNING PROCESS

TECHNICAL FIELD

The present invention relates to a conductive polymer composition containing a polyaniline-based conductive polymer, a coated product and a patterning process using the same.

BACKGROUND ART

In a manufacturing process of a semiconductor device such as an IC, an LSI and the like, fine processing by a lithography method using a photoresist has been conventionally carried out. This is a method in which a substrate is subjected to etching using a mask having a resist pattern obtained by the results that crosslinking or decomposition reaction of a thin film is induced by irradiation of light to remarkably change solubility of the thin film, and the film is subjected to development by a solvent and the like. In recent years, accompanied by high integration of semiconductor devices, high-precision fine processing using short-wavelength light beam has now been required. Development of lithography by an electron beam is being proceeded as a next-generation technology due to its short wavelength characteristics.

As a peculiar problem to lithography using an electron beam, charging phenomenon (charge-up) at the time of exposure is mentioned. This is a phenomenon in which charges accumulate on or in a resist film and become charged when a substrate to be carried out electron beam exposure is covered with the insulating resist film. Due to this charging, the orbital of the incident electron beam is bent, so that a depicting accuracy is significantly reduced. Therefore, a peelable antistatic film to be coated onto an electron beam resist has been investigated.

In the above-mentioned lithography by the electron beam, accompanied by miniaturization to a generation of less than 10 nm, the positional accuracy of electron beam writing to the electron beam resist has becoming more important. With regard to the writing technology, increasing a current of the prior art and MBMW (multi-beam mask writing) and the like are progressing, and it can be expected that a charged state on the resist becomes remarkable so that a conductive polymer having a lower resistivity and a higher charge dissipation ability is desired as a measure of improving the antistatic property of an antistatic film corresponding to development of the writing technology in the future.

In Patent Document 1, it has been disclosed that in order to reduce lowering in writing accuracy on a resist by a charging phenomenon, a conductive polymer film formed by coating on the resist a π-conjugated conductive polymer in which an acidic substituent is introduced in the structure shows an antistatic effect at the time of electron beam writing, and various problems caused by the charging phenomenon, for example, such as an electrostatic bad effect on lithography positional accuracy at the time of electron beam irradiation, distortion of the resist pattern and the like, have been solved. Also, it clearly shows that the conductive polymer film maintains water solubility even after the electron beam writing by a high irradiation dose so that it is possible to remove by washing with water.

In Patent Document 2, a composition comprising a polyaniline-based conductive polymer, a polyacid and H$_2$O has been disclosed, and it has been clearly shown that a complex comprising the polyaniline-based conductive polymer and the polyacid is capable of forming a good film by spin coating with 5 to 10% by mass, and can form an antistatic film in which antistatic effect can be admitted with a film thickness of 150 nm and peeling and washing is possible by H$_2$O.

In Patent Document 3, an antistatic film use technique of a polythiophene-based conductive polymer for an electron beam lithography is disclosed, and an antistatic film function of a complex comprising the polythiophene-based conductive polymer and a polyanion by the effect of adding a gemini type surfactant and the like is shown.

In Patent Document 4, a compound which is subjected to self-doping in a polyaniline molecule has been newly proposed by replacing at least one among H atoms of a benzene ring skeleton of an aniline which is a repeating unit of a polyaniline-based conductive polymer with an acidic group. The polyaniline-based conductive polymer of the above-mentioned Patent Document 2 or 3 is a complex comprising an aniline oligomer which is a π-conjugated system polymer that controls carrier transfer, and a monomer or a polymer having a sulfonic acid terminal that is usually called a dopant, and is dispersed in H$_2$O showing a particle-like behavior therein, so that for subjecting to homogenization of the material, it is necessary to carry out a treatment by a high output homogenizer or a high pressure disperser, and further, after coating on an electron beam resist, a process for removing particle aggregates which become a defect of pattern writing is complicated. To the contrary, the compound described in Patent Document 4 is converted into a solvate with H$_2$O to show molecular behavior, so that the above-mentioned defect factor can be dramatically reduced only by simple filtration.

In Patent Document 5, at the paragraphs 0045 to 0048, it has been proposed to add a basic compound to a composition containing a self-doping compound in an polyaniline molecule for the purpose of neutralizing an acid in order to avoid exerting bad effect on a resist pattern by interlayer diffusion of an acid existing in a film when the composition is formed into the film on the electron beam resist. As basic compounds, ammonium salts of hydroxides such as tetrapropylammonium hydroxide, tetrabutylammonium hydroxide, tetrapentyl-ammonium hydroxide, tetrahexylammonium hydroxide and benzyltrimethylammonium hydroxide, 1,5-diazabicyclo-[4.3.0]-5-nonene (DBN), 1,8-diazabicyclo[5.4.0]-7-undecene (DBU) and a derivative thereof are mentioned. However, since the hydroxide has strong basicity, it neutralizes an acid derived from the polyaniline, but it has strong nucleophilicity simultaneously so that a side reaction occurs in some cases. For example, an acid generator and the like contained in an EB resist often contains an ester bond in the structure as a linker, and the ester bond is subjected to nucleophilic attack by a hydroxide ion, and a portion imparted functions such as diffusion control and dissolution characteristics and the like is eliminated. Therefore, the sulfonic acid ions which became small molecules are promoted to diffuse after irradiation of the electron beam, and as a result, sensitivity fluctuation and pattern failure occur in lithography. On the other hand, whereas 1,5-diazabicyclo[4.3.0]-5-nonene (DBN) and 1,8-diazabicyclo[5.4.0]-7-undecene (DBU) are strong bases, they have weak nucleophilicity so that it can be considered that nucleophilic attack to the ester bond is difficultly occur, but they are small molecules and when the conductive composition is formed as a film on the EB resist, diffusion thereof from the interface to the resist layer occurs and the acid generated from the acid generator after electron beam writing is quenched, and as a result, there is a problem that sensitivity fluctuation and pattern failure occur in lithography.

CITATION LIST

Patent Literature

Patent Document 1: JP Patent No. 2,902,727
Patent Document 2: U.S. Pat. No. 5,370,825
Patent Document 3: JP 2014-009342A
Patent Document 4: JP Patent No. 3,631,910
Patent Document 5: JP 2017-39927A

SUMMARY OF INVENTION

Technical Problem

As the polyaniline compounds shown in Patent Documents 1, 4 and 5, those in which an acidic substituent is introduced into the structure of a monomer unit of the π-conjugated conductive polymer is used, and take forms in which the acidic substituent is self-doped in the π-conjugated conductive polymer chain. However, not all the acidic substituent existing in the π-conjugated conductive polymer after polymerization are doped in the π-conjugated system, but these are present in the polymer as an acid or a salt thereof. In the state of the acid, the polyaniline is formed as an antistatic film on the electron beam resist at the time of electron beam irradiation, and the acid diffuses into the resist layer to exert bad effects on lithography. In addition, for the purpose of controlling the diffusion of the acid, when a strong base such as a hydroxide and the like is added as a neutralizing agent, neutralization itself is difficult, and the unreacted strong base in the film permeates the resist layer to cause a side reaction with the portion which is subjected to nucleophilic attack such as an ester bond in the resist composition, and as a result, bad effects are exerted on sensitivity and lithography. Further, the state of the salt means that, an acidic groups contained in a monomer unit before polymerization are previously neutralized by a strong base such as an amine before polymerization, and the monomer is polymerized and the product is present in a state that it is not treated with a cation exchange resin and the like. At that time, a part of the sulfonic acid salt on the polymer is considered to be in the state of an acid by sulfuric acid which is a by-product of peroxodisulfate used as a polymerization reagent, and the acid derived from the polyaniline chain diffuses from the formed film even after the removal of the single molecular impurities by purification such as ultrafiltration and the like. Therefore, for using the conductive polymer as an antistatic film of an electron beam resist, it must be control diffusion of the acid generated from an acid terminal in the polyaniline by an additive other than the strong base.

The effect of the strong base on the resist is remarkably exhibited in a test of storage stability, which is called PCD (Post Coating Delay), in the state of an antistatic film formed on the resist without irradiating the electron beam. That is, a strongly basic substance existing in the antistatic film gradually penetrates and diffuses into the resist film during storage in an unirradiated state, makes nucleophilic attack to the resist polymer or the acid generator at any time to cut a linker bonding portion of the resist, and cuts off an acid terminal of an electron beam acid generator. In the electron beam writing thereafter, the reaction of the resist outside the writing region is progressing, and an acid with a small molecule is generated and reacts with a resist polymer in the state faster in a diffusion rate than that of an original acid generator and the like, whereby it causes remarkable sensitivity change, film reduction or pattern deterioration in lithography.

In general, a polyaniline complex using an unsubstituted aniline as a raw material shows high conductivity, but has low hydrophilicity and poor dispersibility in $H_2O$, so that film formability on a substrate is extremely bad. To the contrary, in the composition described in Patent Document 2, in a complex comprising a polyaniline-based conductive polymer which becomes a base polymer and a polyacid, by introducing various kinds of substituents into the aniline skeleton, dispersibility of the polyaniline complex in $H_2O$ and film formability on a substrate are improved, and in the above-mentioned uses of the lithography antistatic film by the electron beam, it shows quick response in the peeling and washing process by $H_2O$. However, introducing a substituent(s) other than a hydrogen atom into the aniline skeleton makes it difficult to impart high conductivity. That is, it makes difficult to improve resistance reduction as a physical index showing an antistatic property, and in the above-mentioned future writing process expected to strongly generate a charged state of the resist layer, it cannot respond to sufficient divergence of the charged electric charge.

In the π-conjugated conductive polymer, as a material which is used for the antistatic film use in a writing process of the electron beam lithography, there is a polythiophene-based conductive polymer other than the above-mentioned polyaniline-based conductive polymer. The polythiophene-based conductive polymer generally shows higher conductivity than that of the polyaniline-based conductive polymer, but affinity thereof to $H_2O$ is low as compared with that of the polyaniline-based conductive polymer, and even in the $H_2O$ dispersed material, after once a film is formed, peeling thereof is difficult in a peeling and washing process by $H_2O$, or even if it is peeled, it flows in a solid state such as a flake state and the like without being completely dissolved or dispersed again in $H_2O$, so that there is a possibility of causing serious pattern defects on lithography.

In Patent Document 3, an antistatic film use technology for an electron beam lithography of a polythiophene-based conductive polymer is disclosed, and an antistatic film function and good peelability to $H_2O$ of a complex of the polythiophene-based conductive polymer and a polyanion by the effect of adding a gemini type surfactant and the like are shown. Also, the composition described in Patent Document 3 uses a complex comprising a polythiophene-based conductive polymer and a polyacid as a base polymer, so that there is a possibility that the acid derived from the polyacid exerts an effect on the resist film, similarly to the complex comprising a polyaniline-based conductive polymer and a polyacid described in Patent Document 2, but by using a neutralizing agent such as an amine and the like to alleviate the acidity, the above-mentioned effect on lithography is minimized as small as possible. However, as a result of adding a gemini type surfactant to provide functions of good coatability and peelability, and adding amines to alleviate the acidity, a side reaction by the amine on the resist film is generated to exert an effect on lithography, and in addition, the surface resistance ($\Omega/\square$) of the film which becomes an index of the antistatic property shows a large value which cannot generate sufficient antistatic property, and as a conclusion, a low resistivity inherently possessed by the polythiophene-based conductive polymer does not show as a function. Therefore, in the future, in the writing process which is required to have high antistatic property, there is a concern that it cannot correspond to sufficient divergence of charges.

From the above-mentioned matter, it has been required to develop an antistatic film for an electron beam resist writing, which has good filterability and good film formability of a flat film on an electron beam resist, shows excellent antistatic property in an electron beam writing process due to the property of low resistance, and, without using neutralization by strong bases which exerts bad effects on lithography in order to minimize the effect of an acid diffused from the film, controls a diffusion rate of the acid by salt change of the acid by adding a salt of a carboxylic acid as an additive, and further has good peelability by $H_2O$ or an alkaline developer after writing.

The present invention has been accomplished in view of the above-mentioned circumstances, and an object thereof is to provide a conductive polymer composition which has good filterability and good film formability of a flat film on an electron beam resist and can be suitably used for an antistatic film for electron beam resist writing, showing excellent antistatic property in the electron beam writing process due to the property of low volume resistivity ($\Omega \cdot cm$), and, reducing an effect on lithography by making an effect of an acid diffused from the film minimum, and further having excellent peelability by $H_2O$ or an alkaline developer after writing.

Solution to Problem

In order to accomplish the above-mentioned tasks, the present invention provides a conductive polymer composition which comprises (A) a polyaniline-based conductive polymer having at least one kind or more of a repeating unit represented by the following general formula (1), and (B) a carboxylic acid salt represented by the following general formula (2):

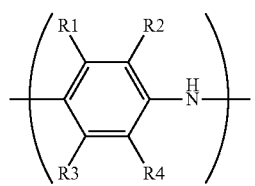

(1)

wherein, R1 to R4 each independently represent a hydrogen atom, an acidic group, a hydroxyl group, a nitro group, a halogen atom, a linear or branched alkyl group having 1 to 24 carbon atoms, a linear, branched or cyclic hydrocarbon group having 1 to 24 carbon atoms containing a hetero atom, or a linear, branched or cyclic hydrocarbon group having 1 to 24 carbon atoms partially substituted with a halogen atom,

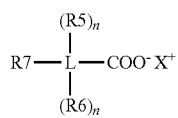

(2)

wherein, $X^+$ represents a lithium ion, a sodium ion, a potassium ion or a nitrogen compound represented by the following general formula (3); L represents a single bond or a linear, branched or cyclic saturated or unsaturated hydrocarbon chain having 1 to 8 carbon atoms in which a hetero atom may be interposed, when L is a single bond, then n=0 and when n is not a single bond, then n=1; R5 and R6 each independently represent a hydrogen atom, a hetero atom, a —COO$^-$X$^+$ group, a hydroxyl group, a linear, branched or cyclic monovalent hydrocarbon group having 1 to 20 carbon atoms in which a hetero atom may be interposed, or a linear, branched or cyclic saturated or unsaturated hydrocarbon group having 1 to 8 carbon atoms having a —COO$^-$X$^+$ group at the end thereof; R7 represents a hydrogen atom, a hydroxyl group or a —COO$^-$X$^+$ group,

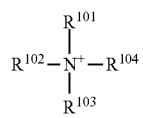

(3)

wherein, $R^{101}$, $R^{102}$, $R^{103}$ and $R^{104}$ each independently represents a hydrogen atom, a linear, branched or cyclic alkyl group, an alkenyl group, an oxoalkyl group or an oxoalkenyl group each having 1 to 12 carbon atoms, an aryl group having 6 to 20 carbon atoms, or an aralkyl group or an aryloxoalkyl group each having 7 to 12 carbon atoms, and a part or whole of the hydrogen atoms of these groups may be substituted by an alkoxy group; $R^{101}$ and $R^{102}$, or $R^{101}$, $R^{102}$ and $R^{104}$ may form a ring, and when a ring is formed, $R^{101}$ and $R^{102}$, and $R^{101}$, $R^{102}$ and $R^{104}$ each represent an alkylene group having 3 to 10 carbon atoms or a heteroaromatic ring having the nitrogen atom in the formula in the ring.

When it is a material containing a carboxylic acid salt represented by the general formula (2) as Component (B), acidity of the polyaniline-based conductive polymer (A) having at least one kind or more of the repeating unit represented by the general formula (1) can be relieved and diffusion of the acid into the adjacent layer can be controlled.

Also, the acidic group is preferably a sulfo group.

When such Component (A) is employed, the effect of the present invention can be more sufficiently obtained.

Further, it is preferable that a content of the Component (B) is 1 part by mass to 70 parts by mass based on 100 parts by mass of the Component (A).

When the content of Component (B) is made such a content, acid diffusion from the conductive film formed by the conductive polymer composition into the contacted adjacent layer can be more reduced.

Moreover, the conductive polymer composition is preferably a material further containing (C) a nonionic surfactant.

When such a material is employed, wettability of the conductive polymer composition to the material to be processed such as a substrate, etc., can be improved.

Furthermore, it is preferable that a content of the Component (C) is 0.1 part by mass to 10 parts by mass based on 100 parts by mass of the Component (A).

When such a material is employed, wettability to the surface of the material to be processed becomes well, and conductivity of the conductive film becomes sufficient.

Also, it is preferable that the conductive polymer composition is a material further containing (D) a water-soluble polymer.

When such a material is employed, uniformity of the film at the time of forming the conductive polymer composition into the film on the material to be processed such as a substrate, etc., can be improved.

Further, it is preferable that a content of the Component (D) is 30 parts by mass to 150 parts by mass based on 100 parts by mass of the Component (A).

When the content of Component (D) is made such a content, sufficient antistatic function can be certainly obtained while improving uniformity of the film.

Moreover, in the present invention, it is provided a coated product which comprises a film of the above-mentioned conductive polymer composition being formed onto a material to be processed.

The conductive film formed by the conductive polymer composition of the present invention is excellent in antistatic property, so that by covering various materials to be processed with such an antistatic film, a coated product having high quality can be obtained.

Furthermore, it is preferable that the material to be processed is a substrate provided with a chemical amplification type resist film.

Also, it is preferable that the material to be processed is a substrate for obtaining resist pattern by pattern irradiating electron beam.

Further, it is preferable that the material to be processed is a substrate provided with a chemical amplification type electron beam resist film having a sensitivity of 20 $\mu C/cm^2$ or more.

When the conductive polymer composition of the present invention is employed, in particular, it can be suitably used for lithography using an electron beam, etc., so that a resist pattern having high sensitivity and high resolution, and having good pattern shape can be obtained.

Moreover, in the present invention, it is to provide a patterning process which comprises forming an antistatic film onto a resist film of a substrate provided with a chemical amplification type resist film using the above-mentioned conductive polymer composition, pattern irradiating an electron beam, and developing it by using $H_2O$ or an alkaline developer to obtain a resist pattern.

According to such a patterning process, an electron beam distortion phenomenon derived from charging of a resist surface at the time of electron beam writing can be prevented, and a resist pattern having high sensitivity and high resolution with good pattern shape can be obtained.

Advantageous Effects of Invention

When such a conductive polymer composition is employed, in a charged state at the time of electron beam resist writing, it can be suitably applied to an antistatic film showing charge dissipation with high efficiency, and positional precision of the electron beam writing can be improved.

Also, the composition containing Component (A) which contains a repeating unit represented by the general formula (1) and Component (B) represented by the general formula (2) shows high conductivity after forming a film onto the substrate and simultaneously, has high affinity to $H_2O$ and good filterability, and also good film formability of a flat film on the electron beam resist, and in the peeling process after film formation, peeling by $H_2O$ or an aqueous alkaline solution becomes easy. In the composition containing such Component (A) and Component (B), a conductive film having good film formability and peelability by $H_2O$ or an aqueous alkaline solution, and showing high conductivity, i.e., low surface resistant property ($\Omega/\square$) is formed, which gives high positional precision in the electron beam writing to the resist, good resist pattern shape, and gives an antistatic film without peeling fragments and insoluble residual film on the resist pattern after resist development, so that it can be suitably used for electron beam lithography.

In addition, according to Component (B), an effect of acid diffusion from the film formed by the composition to the adjacent layer can be controlled, high conductivity and antistatic property with high charge dissipation ability are exhibited, and it is possible to form a conductive film having good film quality.

The composition containing Component (A) and Component (B) of the present invention shows good peelability by $H_2O$ or an aqueous alkaline solution after formation of the film. In the electron beam writing to the electron beam resist and the patterning process, the formed film comprising the composition is capable of peeling by $H_2O$ before heat treatment after writing, and it is possible to peel off by an alkaline aqueous solution (an alkaline developer) similarly at the elution portion of the resist pattern in the resist pattern development process after heat treatment after writing. Thus, peeling of the film by $H_2O$ or an aqueous alkaline solution is easy, so that it shows an effect of reducing fine defects derived from a film formation material residue in the peeling process after electron beam writing.

In addition, (C) the nonionic surfactant and (D) the water-soluble polymer do not inhibit peelability by $H_2O$ or an aqueous alkaline solution after film formation in the composition containing Component (A) and Component (B) of the present invention. The formed film by the composition containing (C) the nonionic surfactant and (D) the water-soluble polymer is easy in peeling the film by $H_2O$ or an aqueous alkaline solution, and before heat treatment after electron beam writing, it is possible to peel off by $H_2O$, and after heat treatment after electron beam writing, in the resist pattern development process in lithography, it is possible to peel off by an alkaline aqueous solution (an alkaline developer) similarly at the elution portion of the resist pattern. Thus, peeling of the film by $H_2O$ or an aqueous alkaline solution is easy, so that it shows an effect of reducing ultrafine defects derived from a film formation residue in the peeling process after electron beam writing.

In addition, by covering various materials to be processed with an antistatic film formed by using the conductive polymer composition of the present invention, a coated product having high quality can be obtained.

DESCRIPTION OF EMBODIMENTS

As described above, a conductive polymer composition which has good coatability and film formability to a substrate and can form a conductive film with good film quality, is excellent in peelability by $H_2O$ or an aqueous alkaline solution, exhibits antistatic property with high charge dissipation ability, does not use a strong base for controlling diffusion of the acid generated from the film to the adjacent layer, and is suitably used for a high conductivity antistatic film in resist lithography using an electron beam and the like has been required.

Hereinafter, embodiments of the present invention will be explained in detail, but the present invention is not limited thereto.

In a polyaniline compound showing high conductivity which uses Component (A) alone as a raw material, a sulfo group which is not consumed in doping is present so that a solution or a dispersion thereof shows acidity. When a liquid material using Component (A) alone as a raw material is formed as an antistatic film on an electron beam resist at the time of electron beam irradiation, an acid diffuses into the resist layer which exerts bad effect on the lithography. In addition, when a strong base such as a hydroxide, etc., is added as a neutralizing agent for the purpose of controlling diffusion of the acid, neutralization itself is difficult, and also, when the composition is formed as an antistatic film on the electron beam resist at the time of electron beam irradiation, if an excessive strong base is present in the film, it penetrates into the resist layer, so that it causes side reaction with a portion to be nucleophilically attacked such as an ester bond in a resist base polymer or an acid generator, or reacts with an acid generated from an acid generator in the resist after writing, whereby it exerts bad effects on writing sensitivity and lithography after development.

The present inventors have intensively studied about the above-mentioned tasks, and as a result, they have found that by coating a composition containing a polyaniline-based conductive polymer of Component (A) which contains a repeating unit represented by the general formula (1) and a carboxylic acid salt of Component (B) represented by the general formula (2) on a resist at the time of electron beam irradiation to an electron beam resist, an antistatic film having good film formability, film quality and film flatness, showing low surface resistance (Ω/□), i.e., high conductivity, having good peelability by H₂O or an aqueous alkaline solution, and diffusion of an acid generated from Component (A) into the resist being controlled is formed.

In addition, the following was found. By adding (C) a nonionic surfactant and (D) a water-soluble polymer or either one of which to the above-mentioned conductive polymer dispersion, wettability of the composition containing a polyaniline-based conductive polymer of Component (A) which contains a repeating unit represented by the general formula (1) and a carboxylic acid salt of Component (B) represented by the general formula (2) to a material to be processed surface becomes better so that film formability is improved and film uniformity is also improved.

Also, the conductive polymer composition to be suitably used for the above-mentioned uses of the present invention can be obtained by, for example, mixing a polyaniline-based polymer of Component (A), a carboxylic acid salt of Component (B) and a solvent, and if necessary, a surfactant of Component (C), and a water-soluble polymer of Component (D), and filtering with a filter, etc. Further, a coated product and a substrate provided with a thin film formed by using the conductive polymer composition of the present invention can be obtained by, for example, coating the conductive polymer composition of the present invention on a substrate, and subjecting to heat treatment, IR or UV irradiation, etc.

Hereinafter, the present invention will be explained in further detail, but the present invention is not limited thereto.

<Conductive Polymer Composition>

The present invention is directed to a conductive polymer composition which comprises (A) a polyaniline-based conductive polymer having at least one kind or more of a repeating unit represented by the following general formula (1), and (B) a carboxylic acid salt represented by the following general formula (2).

[(A) Polyaniline-Based Conductive Polymer]

The polyaniline-based conductive polymer of Component (A) contained in the conductive polymer composition of the present invention is a polyaniline-based conductive polymer having at least one kind or more a repeating unit represented by the following general formula (1).

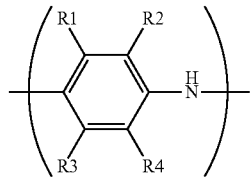

wherein, R1 to R4 each independently represent a hydrogen atom, an acidic group, a hydroxyl group, a nitro group, a halogen atom, a linear or branched alkyl group having 1 to 24 carbon atoms, a linear, branched or cyclic hydrocarbon group having 1 to 24 carbon atoms containing a hetero atom, or a linear, branched or cyclic hydrocarbon group having 1 to 24 carbon atoms partially substituted with a halogen atom.

The polyaniline-based conductive polymer is a π-conjugated system polymer, and is an organic polymer in which the main chain is constituted by aniline, or a derivative other than a para-substituted material of aniline. In the present invention, Component (A) is preferably a polymer containing the repeating unit represented by the general formula (1) (aniline monomer) in which at least one of R1 to R4 is a sulfo group. Incidentally, the sulfo group is contained in the acidic group. Also, Component (A) may be a material having no sulfo group in the structure of the polymer, and exhibiting conductive function by doping with a dopant such as an acid or a halogen ion, etc., out of the molecule. However, from the viewpoints of high affinity to H₂O, filterability with high efficiency, peelability to H₂O or an alkali developing solution after film formation, low defectivity in lithography, easiness in polymerization, low reaggregation during storage, and stability in the air, as Component (A), a self-doping type having at least one kind or more the repeating unit represented by the general formula (1), i.e., an intramolecular doping type polyaniline-based conductive polymer is particularly effective.

The above-mentioned intramolecular doping type polyaniline-based conductive polymer exhibits the highest conductivity when it is constituted only by an aniline in which at least one of R1 to R4 of the repeating unit represented by the general formula (1) is substituted by a sulfo group. In addition, in order to further strengthen H₂O affinity of such a polyaniline-based conductive polymer, a hydrophilic substituent(s) may be introduced other than the sulfo group in R1 to R4. As the hydrophilic substituent(s), a functional group such as an alkoxyl group, a carboxyl group, a hydroxyl group, etc., can be introduced.

Representative examples of the sulfonic acid-substituted aniline may be mentioned aminobenzene-sulfonic acid derivatives. The aminobenzenesulfonic acid derivatives are preferably o- or m-aminobenzene-sulfonic acid, aniline 2-6-disulfonic acid, aniline 3-5-disulfonic acid.

As the aniline having a sulfo group other than the aminobenzenesulfonic acid, there may be mentioned alkyl group-substituted benzenesulfonic acids such as methylaminobenzenesulfonic acid, ethylaminobenzene-sulfonic acid, n-propylaminobenzenesulfonic acid, iso-propylaminobenzenesulfonic acid, n-butylaminobenzene-sulfonic acid, sec-butylaminobenzenesulfonic acid, t-butylaminobenzenesulfonic acid, etc., alkoxyamino-benzenesulfonic acids such as methoxyaminobenzene-sulfonic acid, ethoxyaminobenzenesulfonic acid, propoxyaminobenzenesulfonic acid, etc., hydroxy-substituted aminobenzenesulfonic acids, nitro group-substituted aminobenzenesulfonic acids, halogen group-substituted aminobenzenesulfonic acids such as fluoro-aminobenzenesulfonic acid, chlorobenzenesulfonic acid, bromobenzenesulfonic acid, etc. Among these, alkoxy-aminobenzenesulfonic acids and hydroxy-substituted aminobenzenesulfonic acids are suitably used from the viewpoints of $H_2O$ affinity, conductivity, reactivity and thermal stability of the formed product of the above-mentioned intramolecular doping type polyaniline-based conductive polymer. Also, these aminobenzenesulfonic acids may be used a single kind alone or may be used two or more kinds in admixture with an arbitrary ratio.

Further, the polyaniline-based conductive polymer of Component (A) can be also formed by copolymerizing an aniline in which at least one of R1 to R4 which are a repeating unit represented by the general formula (1) is substituted by a sulfo group, and an aniline having no sulfo group. In such a case, affinity to $H_2O$ may sometimes lower due to lowering in an existing ratio of the sulfo group in the forming polymer, and in order to compensate for this, it is desirable to introduce a substituent(s) having strong affinity to $H_2O$ into the aniline having no sulfo group. As the strong hydrophilic substituent, a functional group such as an alkoxyl group, a carboxyl group, a hydroxyl group, etc., are desirable.

Examples of the aniline monomer having high affinity to $H_2O$, which is desirable when an aniline having no sulfo group is copolymerized as a repeating unit, there may be mentioned 2-methoxyaniline, 2-isopropoxyaniline, 3-methoxyaniline, 2-ethoxyaniline, 3-ethoxyaniline, 3-isopropoxyaniline, 3-hydroxyaniline, 2,5-dimethoxyaniline, 2,6-dimethoxyaniline, 3,5-dimethoxyaniline, 2,5-diethoxyaniline, 2-methoxy-5-methylaniline, 5-tertbutyl-2-methoxyaniline, 2-hydroxy-aniline, 3-hydroxyaniline, etc.

Among these, 2-methoxyaniline, 3-methoxyaniline, 2-ethoxyaniline, 3-ethoxyaniline, 2-isopropoxyaniline, 3-isopropoxyaniline and 3-hydroxyaniline are suitably used from the viewpoints of $H_2O$ affinity, conductivity, reactivity and thermal stability of the formed product even when they are copolymerized with an aniline monomer wherein at least one of R1 to R4 is a sulfo group in the general formula (1).

[(B) Carboxylic Acid Salt]

As Component (B) contained in the conductive polymer composition of the present invention, those which is a salt of a carboxylic acid represented by the following general formula (2), and contains one carboxyl group or two or more in an aliphatic, aromatic or cycloaliphatic, etc can be used. In the following general formula (2), $X^+$ forms a salt with a carboxylic acid ion.

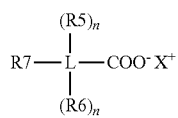

(2)

wherein, $X^+$ represents a lithium ion, a sodium ion, a potassium ion or a nitrogen compound represented by the following general formula (3); L represents a single bond or a linear, branched or cyclic saturated or unsaturated hydrocarbon chain having 1 to 8 carbon atoms in which a hetero atom may be interposed, when L is a single bond, then n=0 and when L is not a single bond, then n=1; R5 and R6 each independently represent a hydrogen atom, a hetero atom, a —COO$^-$X$^+$ group, a hydroxyl group, a linear, branched or cyclic monovalent hydrocarbon group having 1 to 20 carbon atoms in which a hetero atom may be interposed, or a linear, branched or cyclic saturated or unsaturated hydrocarbon group having 1 to 8 carbon atoms having a —COO$^-$X$^+$ group at the end thereof. R7 represents a hydrogen atom, a hydroxyl group or a —COO$^-$X$^+$ group,

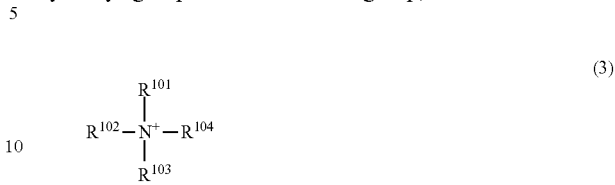

(3)

wherein, $R^{101}$, $R^{102}$, $R^{103}$ and $R^{104}$ each independently represents a hydrogen atom, a linear, branched or cyclic alkyl group, an alkenyl group, an oxoalkyl group or an oxoalkenyl group each having 1 to 12 carbon atoms, an aryl group having 6 to 20 carbon atoms, or an aralkyl group or an aryloxoalkyl group each having 7 to 12 carbon atoms, and a part or whole of the hydrogen atoms of these groups may be substituted by an alkoxy group; $R^{101}$ and $R^{102}$, or $R^{101}$, $R^{102}$ and $R^{104}$ may form a ring, and when a ring is formed, $R^{101}$ and $R^{102}$, and $R^{101}$, $R^{102}$ and $R^{104}$ each represent an alkylene group having 3 to 10 carbon atoms or a heteroaromatic ring having the nitrogen atom in the formula in the ring.

As Component (B), those having high water solubility is preferable for the sake of handling. In addition, from the viewpoints of conductivity when it is made the composition with the polyaniline-based conductive polymer of Component (A), and dispersibility in the composition and in a film after forming the film, those having a molecular weight as a carboxylic acid of 250 or less is preferable.

Representative carboxylic acids which form a salt with $X^+$ represented by the general formula (2) may be mentioned, formic acid, acetic acid, propionic acid, butyric acid, isobutyric acid, valeric acid, pivalic acid, hydroangelic acid, isovaleric acid, caproic acid, 2-methylpentanoic acid, 3-methylpentanoic acid, 4-methylpentanoic acid, 2,2-dimethylbutanoic acid, 2,3-dimethylbutanoic acid, 3,3-dimethylbutanoic acid, 2-ethylbutanoic acid, enanthic acid, caprylic acid, methacrylic acid, crotonic acid, isocrotonic acid, benzoic acid, oxalic acid, malonic acid, fumaric acid, succinic acid, glutaric acid, adipic acid, pimelic acid, suberic acid, azelaic acid, sebacic acid, phthalic acid, isophthalic acid, terephthalic acid, lactic acid, pyruvic acid, tartaric acid, citric acid, isocitric acid, aspartic acid, glutamic acid, monochloroacetic acid, dichloroacetic acid, trichloroacetic acid, trifluoroacetic acid, nitroacetic acid, triphenylacetic acid, etc.

[Other Components]
(Surfactant)

In the present invention, in order to increase wettability to the material to be processed such as a substrate, etc., a surfactant may be added. Such a surfactant may be mentioned various kinds of surfactants such as nonionic, cationic and anionic, and from stability of the conductive polymer, (C) a nonionic surfactant is particularly preferable. Specifically, for example, nonionic surfactants such as a polyoxyethylene alkyl ether, a polyoxyethylene alkylphenyl ether, a polyoxyethylene carboxylic acid ester, a sorbitan ester, a polyoxyethylene sorbitan ester, etc., are suitable, and there may be mentioned cationic surfactants such as an alkyltrimethylammonium chloride, an alkylbenzylammonium chloride, etc., anionic surfactants such as an alkyl or alkylallyl sulfate, an alkyl or alkylallyl sulfonate, a dialkyl sulfosuccinate, etc., and amphoteric surfactants such as amino acid type, a betaine type, etc.

When such a material is employed, wettability of the conductive polymer composition to the material to be processed such as a substrate, etc., can be increased.

(Water-Soluble Polymer)

In addition, in the present invention, in order to improve uniformity of the film when the film is formed onto the material to be processed such as a substrate, etc., (D) a water-soluble polymer may be further added. Such a water-soluble polymer is preferably a homopolymer or a copolymer having hydrophilic repeating units. Also, such a hydrophilic repeating unit is preferably those having a vinyl group as a polymerizable functional group, and further, from the meaning of controlling diffusion of an acid generated from the component of (A), it is preferably a compound containing a nitrogen atom in the molecule. At this time, if the nitrogen atom in the molecule does not have nucleophilicity, it is more preferable since there is no fear of generating a side reaction to a functional group to be nucleophilically attacked such as an ester group contained in the resist polymer or the acid generator in the resist composition as mentioned above. Therefore, as the above-mentioned repeating unit, a nitrogen-containing heterocyclic compound is more desirable than the material having a nitrogen atom at the terminal like acrylamides. Also, at that time, a material in which the nitrogen atom is bonded to the vinyl group which forms the main chain of the cyclic structure is more preferable. Such a repeating unit may be mentioned N-vinyl-2-pyrrolidone, N-vinylcaprolactam, etc.

When such a material is employed, it is possible to improve uniformity of the film when the conductive polymer composition is coated onto a material to be processed such as a substrate to form a film.

<Manufacturing Method of Polyaniline-Based Conductive Polymer>

In Patent Document 4 (Japanese Patent No. 3,631,910), a self-doping type sulfonated polyaniline which exhibits conductivity without forming a complex with a doping agent or a polymer dopant and a synthetic method thereof have been proposed. Many of the polyaniline materials before these were materials to which a dopant was added, but were insoluble in almost all the organic solvents, and the purified polymer had basically low solubility even when the solvent was $H_2O$, and even if it was possible to disperse in $H_2O$ using a polymer dopant, it had particle property so that it was difficult to remove aggregates of particles which could be a cause of defects in the uses such as mounting as a light transmission film for electronic devices and thin film formation in relation with semiconductors and the like, and also, in filtration purification to be usually used for purification of a polymer, there were a problem in stable production that aggregates were filtered out by a filtration filter to cause fluctuation of the solid content and there was a limit to reduce the pore size of the filtration filter and the like.

When Component (A) handled in the present invention is made a self-doping type polyaniline, for example, the above-mentioned repeating unit represented by the general formula (1) (that is, Component (A)) can be obtained by subjecting to oxidation polymerization by adding an oxidizing agent into an aqueous solution or a mixed solution of water and an organic solvent. As the polymerization recipe of Component (A), a well-known method can be applied and it is not particularly limited. Specifically, a monomer for obtaining a repeating unit represented by the general formula (1) can be polymerized by various kinds of synthetic methods such as a chemical oxidation method, an electrolytic oxidation method, etc. As such a method, for example, the prescriptions described in Japanese Patent No. 3,154,460 and Japanese Patent No. 2,959,968 can be applied.

As mentioned above, the polyaniline-based conductive polymer of Component (A) formed by the above-mentioned polymerization method is soluble in both of $H_2O$ and an organic solvent due to its molecular properties, so that filtration and purification become easy, and generation of aggregates which become a factor of defects is reduced and efficiency of removal by filtration is also improved.

As the polymerization initiator to be used for polymerization of Component (A), peroxodisulfate salts (persulfate salt) such as ammonium peroxodisulfate (ammonium persulfate), sodium peroxodisulfate (sodium persulfate), potassium peroxodisulfate (potassium persulfate), etc., peroxides such as hydrogen peroxide, ozone, etc., organic peroxides such as benzoyl peroxide, etc., and oxygen, etc., can be used.

As the reaction solvent to be used for carrying out oxidation polymerization, water or a mixed solvent of water and a solvent can be used. The solvent herein used is preferably a solvent which is miscible with water, and capable of dissolving or dispersing Component (A) and Component (B). For example, there may be mentioned an alcohol such as methanol, ethanol, propanol, butanol, etc., a polyvalent aliphatic alcohol such as ethylene glycol, propylene glycol, 1,3-propanediol, dipropylene glycol, 1,3-butylene glycol, 1,4-butylene glycol, D-glucose, D-glucitol, isoprene glycol, 1,2-butanediol, 1,3-butanediol, 1,4-butanediol, 2,3-butane diol, 1,2-pentanediol, 1,5-pentanediol, 1,2-hexanediol, 1,6-hexanediol, 1,9-nonanediol, neopentyl glycol, etc., a linear ether such as dialkyl ether, ethylene glycol monoalkyl ether, ethylene glycol dialkyl ether, propylene glycol monoalkyl ether, propylene glycol dialkyl ether, polyethylene glycol dialkyl ether, polypropylene glycol dialkyl ether, etc., a cyclic ether compound such as dioxane, tetrahydrofuran, etc., a polar solvent such as cyclohexanone, methyl amyl ketone, ethyl acetate, butanediol monomethyl ether, propylene glycol monomethyl ether, ethylene glycol monomethyl ether, butanediol monoethyl ether, propylene glycol monoethyl ether, ethylene glycol monoethyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, t-butyl acetate, t-butyl propionate, propylene glycol mono-t-butyl ether acetate, γ-butyrolactone, N-methyl-2-pyrrolidone, N,N'-dimethylformamide, N,N'-dimethylacetamide, dimethyl-sulfoxide, hexamethylene phosphoric triamide, etc., a carbonate compound such as ethylene carbonate, propylene carbonate, etc., a heterocyclic compound such as 3-methyl-2-oxazolidinone, etc., and a nitrile compound such as acetonitrile, glutaronitrile, methoxyacetonitrile, propionitrile, benzonitrile, etc. These solvents may be used alone, or may be a mixture of two or more kinds. A formulation amount of these solvents miscible with water is preferably 50% by mass or less based on the whole reaction solvent.

Polymerization of the polyaniline-based conductive polymer of Component (A) can be carried out by dissolving the monomer(s) for obtaining the above-mentioned repeating unit represented by the general formula (1) in a solvent, and dropping a polymerization initiator thereto, and when solubility of the monomer is low, an initial concentration may be sometimes low in order to form a uniform reaction system. The lowering in the initial concentration causes lowering in polymerization reaction, and the forming polymer cannot have a molecular weight for possessing sufficient conductivity or film formability in some cases. Therefore, in order to sufficiently increase the initial concentration of the monomer at the time of polymerization, it is desirable to add a base to the monomer to form a salt with a sulfo group in the monomer to increase solubility thereof and to subject to polymerization.

The initial concentration of the monomer for obtaining the repeating unit of the general formula (1) in the polymerization is preferably 1.0 to 2.0 mol/L, and further 1.5 to 1.8 mol/L is more preferable.

The above-mentioned repeating unit represented by the general formula (1) is more preferably subjected to oxidation polymerization by an oxidizing agent in the presence of a base. The sulfo group in the monomer for obtaining a repeating unit of the general formula (1) in the polymerization forms a salt with the above-mentioned base. An acidity of the solution at this time is preferably pH<7.0.

Also, when the above-mentioned polymerization is carried out, in an aqueous solution or a mixed solvent of water and an organic solvent, an organic cation represented by the following general formula (4) or an ion of an alkali metal or an alkaline earth metal co-presented as a base forms a salt with an acidic group in the repeating unit of the general formula (1).

The organic cation represented by the following general formula (4) is preferably those formed from ammonia, aliphatic amines, cyclic saturated amines, cyclic unsaturated amines in contact with an acid.

(4)

wherein, $R^{201}$, $R^{202}$, $R^{203}$ and $R^{204}$ each independently represents a hydrogen atom, a linear, branched or cyclic alkyl group, an alkenyl group, an oxoalkyl group or an oxoalkenyl group each having 1 to 12 carbon atoms, an aryl group having 6 to 20 carbon atoms, or an aralkyl group or an aryloxoalkyl group each having 7 to 12 carbon atoms, and a part or whole of the hydrogen atoms of these groups may be substituted by an alkoxy group. $R^{201}$ and $R^{202}$, or $R^{201}$, $R^{202}$ and $R^{204}$ may form a ring, and when a ring is formed, $R^{201}$ and $R^{202}$, and $R^{201}$, $R^{202}$ and $R^{204}$ each represent an alkylene group having 3 to 10 carbon atoms or a heteroaromatic ring having the nitrogen atom in the formula in the ring.

The polyaniline-based conductive polymer of Component (A) thus polymerized is filtered and isolated as precipitated material in the reaction mixture. As the filtration method, reduced pressure filtration, pressure filtration, centrifugation, centrifugal filtration and the like are used, and from easiness in the method and adaptability to large scale synthesis, filtration under reduced pressure is suitable and the filtrated precipitates can be washed with a poor solvent on a funnel.

Also, the polyaniline-based conductive polymer of Component (A) thus obtained is dissolved again in $H_2O$ after drying, and impurities can be removed by the method of ultrafiltration and the like.

As the system of the ultrafiltration, a pressurization system, a cross-flow system and the like are mentioned, and in the viewpoints of productivity and a scale of the purified material, it is preferable to use a cross-flow system. In addition, even in the cross-flow system, depending on a prescription, there are a continuous circulation system (purification is controlled by time, and in a purification process, a stock solution is diluted by adding a solvent as needed to cope with a high viscosity by concentration.) and a sequential processing system (for purifying a stock solution, a process in which at the time of concentrating to a concentration of 2-fold, it is diluted to the original concentration is regarded as one process, and the process is repeated until the desired degree of purification is achieved.), and it can be processed by either of the prescriptions.

Also, as the structure of the membrane to be used for ultrafiltration, there are a flat membrane type, a hollow fiber membrane type, a tubular membrane type, a spiral membrane type, and the like, and as a material of the separating membrane, there are cellulose, cellulose acetate, polysulfone, polypropylene, polyester, polyethersulfone, polyvinylidene fluoride and the like, and in the present process, there is no limitation in any of the combinations, and in the case that the solvent of the purified material is $H_2O$ or an acidic solution, a separation membrane made of polyethersulfone is desirable, and the structure of the membrane is preferably to use a hollow fiber membrane type in the viewpoints of a scale of the treating liquid and treatment efficiency.

Considering that the objective substances to be removed in the ultrafiltration process are a small molecule of an unreacted substance and a polymerization by-product, a fractionation molecular weight of the membrane is preferably in the range of 1,000 to 150,000, and further preferably in the range of 5,000 to 30,000.

Also, at this time, considering concentration of the purified stock solution to 2-fold concentration and efficiency of dialysis by a filtration membrane, a concentration of the stock solution is preferably 0.5 to 1.5% by weight.

In the system of the ultrafiltration, when purification is carried out by a cross-flow sequential processing system, impurity ions in the filtrate can be quantified by ion chromatography at each stage. Here, in the ions which can be quantified by analysis, there are $SO_4^{2-}$, $NH_4^+$, $Na^+$ and the like, and other ions can be also appropriately made an object to be quantified. The concentrations of $SO_4^{2-}$, $NH_4^+$ and $Na^+$ at the time of completion of ultrafiltration purification are preferably 10 ppm or less, and more preferably 1 ppm or less.

The polyaniline-based conductive polymer of Component (A) purified by ultrafiltration is a solution of $H_2O$ at the time of completion of the purification, and can be precipitated and purified again with a water-soluble poor solvent such as acetone and the like. The precipitated polyaniline-based conductive polymer of Component (A) is treated by filtration under reduced pressure and the filter-separated precipitate can be washed again with a poor solvent.

<Manufacturing Method of Conductive Polymer Composition>

The conductive polymer composition suitably used for the above-mentioned uses of the present invention can be obtained by, for example, mixing the polyaniline-based polymer of Component (A), the carboxylic acid salt of Component (B) and a solvent, and further, if necessary, the nonionic surfactant of Component (C) and the water-soluble polymer of Component (D), and filtering through a filter and the like.

At this time, it is preferable to use $H_2O$ as a main solvent considering that either of the polyaniline-based conductive polymer of Component (A) and the carboxylic acid salt of Component (B) in the present invention, and further, if necessary, the nonionic surfactant of Component (C) and the water-soluble polymer of Component (D) is to be dissolved, and considering peeling of the electron beam resist on the substrate onto which a film is to be formed and the effect on resist lithography by mixing.

A solid content of Component (A) in the composition may vary depending on the charge diffusion property and film thickness required for the antistatic film of the electron beam resist, and considering peeling immediately after electron beam writing or peelability with high efficiency at development, it is preferably 0.05 to 1.0 wt %, and further, more preferably 0.1 to 0.3 wt %.

Also, at this time, the content of Component (B) is preferably 1 part by mass to 70 parts by mass based on 100 parts by mass of Component (A). Further, the content of Component (B) is preferably 3 parts by mass to 40 parts by mass based on 100 parts by mass of Component (A), moreover preferably 5 parts by mass to 30 parts by mass. In addition, the content of Component (B) may be 10 parts by mass to 70 parts by mass based on 100 parts by mass of Component (A), and also may be 10 parts by mass to 50 parts by mass.

If the contents of Component (A) and Component (B) are made as mentioned above, acid diffusion from the conductive film formed by the conductive polymer composition to the contacting adjacent layers can be more reduced. When a material to be processed to which such a conductive film is to be formed is a substrate provided with a chemical amplification type resist film and the object thereof is to obtain an antistatic effect at the time of electron beam writing, the conductive film expresses the antistatic effect and makes the writing position high precision, and the effect of acid diffusion from the conductive film to the resist is reduced so that a high resolution resist pattern can be obtained.

In addition, when (C) a nonionic surfactant is to be added, the content thereof is preferably 0.1 part by mass to 10 parts by mass based on 100 parts by mass of the component of (A), moreover, it is more preferably 0.5 part by mass to 5 parts by mass.

Furthermore, when (D) a water-soluble polymer is to be added, the content thereof is preferably 30 parts by mass to 150 parts by mass based on 100 parts by mass of the component of (A), moreover, it is more preferably 90 parts by mass to 120 parts by mass.

When the conductive polymer composition explained above is employed, the composition has good filterability and coatability, and an antistatic film suitable for electron beam lithography can be formed.

The conductive polymer composition thus obtained can form an antistatic film by coating it onto an electron beam resist or a material to be processed such as a substrate and the like, by various methods. Specifically, there may be mentioned coating with a spin coater and the like, bar coater, dipping, comma coating, spray coating, roll coating, screen printing, flexographic printing, gravure printing, inkjet printing and the like. After coating, by subjecting to heat treatment using a hot air circulation furnace, a hot plate, etc., IR or UV irradiation, etc., a conductive film can be formed.

Further, the conductive polymer composition of the present invention can be suitably used not limited only to an antistatic film relating to lithography, but also as a material for forming a laminated film as a device constitutional element in an organic thin film device. Moreover, it can be suitably used as a material for forming an electrode film such as a transparent electrode use for an organic EL display, an organic EL lighting, a solar cell and the like from excellent conductivity, film formability and transparency, or a material for forming a carrier transfer film similarly such as a carrier injection layer or a carrier transfer layer uses for an organic EL display, an organic EL lighting, a solar battery and the like from the properties exhibiting carrier transfer with high efficiency derived from a π-conjugated system network.

When Component (B) is used in the conductive polymer composition of the present invention, even when it is used as a formation layer in a multilayer structure in the constitution of an organic thin film device, it does not exert any bad effect by an acid on an adjacent layer in the laminated structure, so that it is possible to avoid degeneration at the interface of the constitutional materials of the adjacent layer or side reactions and deterioration by an acid after the device is constituted.

<Coated Product>

The present invention is to provide a coated product which comprises the conductive polymer composition of the present invention being formed as a film onto a material to be processed. The conductive film formed by the conductive polymer composition of the present invention is excellent in antistatic property, so that by covering various materials to be processed with such an antistatic film, a coated product with high quality can be obtained.

As the material to be processed, there may be mentioned a glass substrate, a quartz substrate, a photomask blanc substrate, a resin substrate, a silicon wafer, a compound semiconductor wafer such as a gallium arsenide wafer, indium phosphide wafer and the like, and a flexible substrate such as a resin film, ultra-thin film glass, a metal foil and the like, and further, the surface layer of these substrates may be subjected to coating with an organic or inorganic thin film layer for the purpose of planarization, insulation, and prevention of gas and moisture transmission.

As a coated product which is covered with the conductive film obtained by using the conductive polymer composition of the present invention, there may be mentioned, for example, as an antistatic film use, a glass substrate, a resin film, a photoresist substrate, etc., onto which the conductive polymer composition of the present invention has been coated.

Also, the conductive polymer composition of the present invention is to adapt to an independent antistatic film peeling process or an antistatic film peeling process contained in the development process in the electron beam resist writing process, even when the material to be processed is a substrate provided with a chemical amplification type resist film, it can be suitably used, and further when it is a substrate for obtaining a resist pattern by pattern irradiating an electron beam, more suitable results can be obtained. In addition, the material to be processed may be a substrate provided with a chemical amplification type electron beam resist film having a sensitivity of 20 µC/cm$^2$ or more.

<Patterning Process>

Further, the present invention is to provide a patterning process which comprises forming an antistatic film using the conductive polymer composition of the present invention onto a resist film of a substrate provided with a chemical amplification type resist film, pattern irradiating an electron beam, and developing it using $H_2O$ or an alkaline developer to obtain a resist pattern.

The above-mentioned patterning process can be carried out according to the conventional manner other than using the conductive polymer composition of the present invention, and the antistatic film formed by the conductive polymer composition may be, after electron beam writing, peeled off by H₂O before a heat treatment, or may be peeled off by a developer in the resist pattern development process after a heat treatment. After development of the resist pattern, an etching process and other various kinds of processes may be of course carried out.

According to such a patterning process, charging phenomenon at the time of the exposure can be prevented, and a pattern having high sensitivity and high resolution, and also a good pattern shape can be obtained.

EXAMPLE

Hereinafter, the present invention will be explained in more detail by referring to Production Examples, Examples and Comparative Examples, but the present invention is not limited by these.

[Synthesis of Self-Doping Type Polyaniline-Based Conductive Polymer]

In the polyaniline-based conductive polymer material of Component (A) to be used in the present invention, among the above-mentioned repeating units, from the viewpoints of solubility, conductivity and a cost of the raw materials, methoxyaminobenzenesulfonic acids, and further among these, polymerization of 3-amino 4-methoxybenzenesulfonic acid alone is particularly preferable. Further, the coexisting base at the time of polymerization is preferably pyridine from the viewpoints of handling, a cost, basicity and harmlessness to the resist constitutional elements. Even after polymerization and formation, it is contained in the polymer as residual ions, and when the composition is coated onto an electron beam resist, the effect on lithography can be made minimum.

Production Example

Synthesis of Polyaniline-Based Conductive Polymer

In 400 ml of acetonitrile/H₂O mixed liquid (acetonitrile/H₂O=1/1) was dissolved 114.1 g of ammonium peroxodisulfate and to the mixture in the cooled state at 0° C. was added dropwise a liquid in which 101.6 g of 3-amino 4-methoxybenzenesulfonic acid was completely dissolved in 300 ml of an acetonitrile/H₂O mixed liquid (acetonitrile/H₂O=1/1) containing 2 mol/L of pyridine and cooled to 0° C. with a dropping rate of 1.5 ml/min. After completion of the whole amount dropwise addition, the reaction system was raised the temperature to 25° C. and stirred for 12 hours. After stirring, the precipitated material was collected by a Kiriyama funnel, washed with methanol and then dried to obtain 45 g of a powder state conductive polymer. The conductive polymer thus obtained was dissolved again in H₂O so that the concentration became 1.0 wt %, and purification was carried out by ultrafiltration (hollow fiber type, MWCO=1000) until $NH_4^+$ and $SO_4^{2-}$ ion concentrations in the dialysate became <1.0 ppm. The ultrafiltration conditions were made as follows.

Fractionation molecular weight of ultrafiltration membrane: 10K
Cross flow system
Flow amount of supply liquid: 3,000 mL/min
Membrane partial pressure: 0.12 Pa After concentrating the purified liquid, it was added dropwise to 4,000 mL of acetone to obtain a powder. This powder was again dispersed in 2,000 mL of ultrapure water, and added dropwise into 4,000 mL of acetone to recrystallize the powder, and the powder was dried to obtain a brown conductive polymer.

Ultrafiltration can be processed in either of the prescription, in a cross-flow system, of a continuous circulation system (purification is controlled by time, and in a purification process, a stock solution is diluted by adding a solvent as needed to cope with a high viscosity by concentration.) and a sequential processing system (for purifying a stock solution, a process in which at the time of concentrating to a concentration of 2-fold, it is diluted to the original concentration is regarded as one process, and the process is repeated until the desired degree of purification is achieved.), and a sequential processing system can be used to observe the transition of removal of impurity ions in the purification process. In the purification by the sequential processing system, the results of subjecting to quantitative analysis of the concentrations of impurity ions contained in the discharged dialysate by ion chromatography are shown in Table 1.

TABLE 1

| Samples | $SO_4^{2-}$ | $Na^+$ | [ppm] $NH_4^+$ |
|---|---|---|---|
| 1st process | 630 | 0.4 | 200 |
| 2nd process | 440 | 0.1 | 150 |
| 3rd process | 220 | <0.1 | 74 |
| 4th process | 95 | <0.1 | 29 |
| 5th process | 29 | <0.1 | 9.0 |
| 6th process | 6.1 | <0.1 | 2.7 |
| 7th process | 1.0 | <0.1 | 1.0 |
| 8th process | 0.5 | <0.1 | 0.9 |
| 9th process | 0.3 | <0.1 | 0.8 |
| 10th process | 0.2 | <0.1 | 0.7 |

[Preparation of Conductive Polymer Composition Containing Polyaniline-Based Conductive Polymer]

Example 1

In ultrapure water in which 0.051 g of ammonium acetate had been dissolved was dissolved 1.00 g of brown powder of the polyaniline-based conductive polymer obtained in Production Example, and a concentration of the solid content of the polymer was adjusted so as to be 0.20 wt % and after stirring the mixture at room temperature for 2 hours, the mixture was filtered through a polyethylene filter subjected to hydrophilic treatment to make it as Example 1.

Example 2

In the same manner as in Example 1 except for changing ammonium acetate in Example 1 to 0.088 g of tetramethylammonium acetate, a conductive polymer composition was obtained.

Example 3

In the same manner as in Example 1 except for changing ammonium acetate in Example 1 to 0.200 g of tetra-n-butylammonium acetate, a conductive polymer composition was obtained.

Example 4

In the same manner as in Example 1 except for changing ammonium acetate in Example 1 to 0.072 g of sodium methacrylate, a conductive polymer composition was obtained.

Example 5

In the same manner as in Example 1 except for changing ammonium acetate in Example 1 to 0.096 g of sodium benzoate, a conductive polymer composition was obtained.

Example 6

In the same manner as in Example 1 except for changing ammonium acetate in Example 1 to 0.092 g of ammonium benzoate, a conductive polymer composition was obtained.

Example 7

In the same manner as in Example 1 except for changing ammonium acetate in Example 1 to 0.24 g of tetra-n-butylammonium benzoate, a conductive polymer composition was obtained.

Example 8

In the same manner as in Example 1 except for changing ammonium acetate in Example 1 to 0.045 g of sodium oxalate, a conductive polymer composition was obtained.

Example 9

In the same manner as in Example 1 except for changing ammonium acetate in Example 1 to 0.047 g of ammonium oxalate, a conductive polymer composition was obtained.

Example 10

In the same manner as in Example 1 except for changing ammonium acetate in Example 1 to 0.054 g of sodium succinate, a conductive polymer composition was obtained.

Example 11

In the same manner as in Example 1 except for changing ammonium acetate in Example 1 to 0.080 g of dipotassium phthalate, a conductive polymer composition was obtained.

Example 12

In the same manner as in Example 1 except for changing ammonium acetate in Example 1 to 0.065 g of trisodium citrate, a conductive polymer composition was obtained.

Example 13

In the same manner as in Example 1 except for changing ammonium acetate in Example 1 to 0.054 g of triammonium citrate, a conductive polymer composition was obtained.

Example 14

In ultrapure water in which 0.051 g of ammonium acetate had been dissolved was dissolved 0.03 g of acetylene glycol-based surfactant SURFYNOL 465 (available from Nisshin Chemical Industry Co., Ltd.) as a nonionic surfactant, and further dissolved 1.00 g of brown powder of a polyaniline-based conductive polymer obtained in Production Example, and a concentration of the solid content of the polymer was adjusted so as to be 0.20 wt %. After stirring at room temperature for 2 hours, the mixture was filtered through a polyethylene filter subjected to hydrophilic treatment to make it as Example 14.

Example 15

In the same manner as in Example 14 except for changing ammonium acetate in Example 14 to 0.088 g of tetramethylammonium acetate, a conductive polymer composition was obtained.

Example 16

In the same manner as in Example 14 except for changing ammonium acetate in Example 14 to 0.200 g of tetra-n-butylammonium acetate, a conductive polymer composition was obtained.

Example 17

In the same manner as in Example 14 except for changing ammonium acetate in Example 14 to 0.072 g of sodium methacrylate, a conductive polymer composition was obtained.

Example 18

In the same manner as in Example 14 except for changing ammonium acetate in Example 14 to 0.096 g of sodium benzoate, a conductive polymer composition was obtained.

Example 19

In the same manner as in Example 14 except for changing ammonium acetate in Example 14 to 0.092 g of ammonium benzoate, a conductive polymer composition was obtained.

Example 20

In the same manner as in Example 14 except for changing ammonium acetate in Example 14 to 0.24 g of tetra-n-butylammonium benzoate, a conductive polymer composition was obtained.

Example 21

In the same manner as in Example 14 except for changing ammonium acetate in Example 14 to 0.045 g of sodium oxalate, a conductive polymer composition was obtained.

Example 22

In the same manner as in Example 14 except for changing ammonium acetate in Example 14 to 0.047 g of ammonium oxalate, a conductive polymer composition was obtained.

Example 23

In the same manner as in Example 14 except for changing ammonium acetate in Example 14 to 0.054 g of sodium succinate, a conductive polymer composition was obtained.

Example 24

In the same manner as in Example 14 except for changing ammonium acetate in Example 14 to 0.080 g of dipotassium phthalate, a conductive polymer composition was obtained.

Example 25

In the same manner as in Example 14 except for changing ammonium acetate in Example 14 to 0.065 g of trisodium citrate, a conductive polymer composition was obtained.

Example 26

In the same manner as in Example 14 except for changing ammonium acetate in Example 14 to 0.054 g of triammonium citrate, a conductive polymer composition was obtained.

Example 27

In ultrapure water in which 0.051 g of ammonium acetate had been dissolved were dissolved 0.03 g of acetylene glycol-based surfactant SURFYNOL 465 (available from Nisshin Chemical Industry Co., Ltd.) as a nonionic surfactant and 0.90 g of polyvinylpyrrolidone (available from NACALAI TESQUE, INC.) as a water-soluble polymer compound, and further dissolved 1.00 g of brown powder of a polyaniline-based conductive polymer obtained in Production Example, and a concentration of the solid content of the polymer was adjusted so as to be 0.200 wt %. After stirring at room temperature for 2 hours, the mixture was filtered through a polyethylene filter subjected to hydrophilic treatment to make it as Example 27.

Example 28

In the same manner as in Example 27 except for changing ammonium acetate in Example 27 to 0.088 g of tetramethylammonium acetate, a conductive polymer composition was obtained.

Example 29

In the same manner as in Example 27 except for changing ammonium acetate in Example 27 to 0.20 g of tetra-n-butylammonium acetate, a conductive polymer composition was obtained.

Example 30

In the same manner as in Example 27 except for changing ammonium acetate in Example 27 to 0.072 g of sodium methacrylate, a conductive polymer composition was obtained.

Example 31

In the same manner as in Example 27 except for changing ammonium acetate in Example 27 to 0.096 g of sodium benzoate, a conductive polymer composition was obtained.

Example 32

In the same manner as in Example 27 except for changing ammonium acetate in Example 27 to 0.092 g of ammonium benzoate, a conductive polymer composition was obtained.

Example 33

In the same manner as in Example 27 except for changing ammonium acetate in Example 27 to 0.24 g of tetra-n-butylammonium benzoate, a conductive polymer composition was obtained.

Example 34

In the same manner as in Example 27 except for changing ammonium acetate in Example 27 to 0.045 g of sodium oxalate, a conductive polymer composition was obtained.

Example 35

In the same manner as in Example 27 except for changing ammonium acetate in Example 27 to 0.047 g of ammonium oxalate, a conductive polymer composition was obtained.

Example 36

In the same manner as in Example 27 except for changing ammonium acetate in Example 27 to 0.054 g of sodium succinate, a conductive polymer composition was obtained.

Example 37

In the same manner as in Example 27 except for changing ammonium acetate in Example 27 to 0.080 g of dipotassium phthalate, a conductive polymer composition was obtained.

Example 38

In the same manner as in Example 27 except for changing ammonium acetate in Example 27 to 0.065 g of trisodium citrate, a conductive polymer composition was obtained.

Example 39

In the same manner as in Example 27 except for changing ammonium acetate in Example 27 to 0.054 g of triammonium citrate, a conductive polymer composition was obtained.

Comparative Example 1

In ultrapure water in which 0.067 g of triethylamine had been dissolved was dissolved 1.00 g of brown powder of the polyaniline-based conductive polymer obtained in Production Example, and a concentration of the solid content of the polymer was adjusted so as to be 0.20 wt % and after stirring at room temperature for 2 hours, the mixture was filtered through a polyethylene filter subjected to hydrophilic treatment to make it as Comparative Example 1.

Comparative Example 2

In ultrapure water in which 0.17 g of tetra-n-butylammonium hydroxide had been dissolved was dissolved 1.00 g of brown powder of the polyaniline-based conductive polymer obtained in Production Example, and a concentration of the solid content of the polymer was adjusted so as to be 0.20 wt % and after stirring at room temperature for 2 hours, the mixture was filtered through a polyethylene filter subjected to hydrophilic treatment to make it as Comparative Example 2.

Comparative Example 3

In ultrapure water in which 0.10 g of diazabicycloundecene (DBU) had been dissolved was dissolved 1.00 g of brown powder of the polyaniline-based conductive polymer obtained in Production Example, and a concentration of the solid content of the polymer was adjusted so as to be 0.20 wt % and after stirring at room temperature for 2 hours, the mixture was filtered through a polyethylene filter subjected to hydrophilic treatment to make it as Comparative Example 3.

Comparative Example 4

In ultrapure water in which 0.067 g of triethylamine had been dissolved was dissolved 0.03 g of acetylene glycol-based surfactant SURFYNOL 465 (available from Nisshin Chemical Industry Co., Ltd.) as a nonionic surfactant, and further dissolved 1.00 g of brown powder of a polyaniline-based conductive polymer obtained in Production Example, and a concentration of the solid content of the polymer was adjusted so as to be 0.20 wt %. After stirring at room temperature for 2 hours, the mixture was filtered through a polyethylene filter subjected to hydrophilic treatment to make it as Comparative Example 4.

Comparative Example 5

In ultrapure water in which 0.17 g of tetra-n-butylammonium hydroxide had been dissolved was dissolved 0.03 g of acetylene glycol-based surfactant SURFYNOL 465 (available from Nisshin Chemical Industry Co., Ltd.) as a nonionic surfactant, and further dissolved 1.00 g of brown powder of a polyaniline-based conductive polymer obtained in Production Example, and a concentration of the solid content of the polymer was adjusted so as to be 0.20 wt %. After stirring at room temperature for 2 hours, the mixture was filtered through a polyethylene filter subjected to hydrophilic treatment to make it as Comparative Example 5.

Comparative Example 6

In ultrapure water in which 0.10 g of diazabicycloundecene (DBU) had been dissolved was dissolved 0.03 g of acetylene glycol-based surfactant SURFYNOL 465 (available from Nisshin Chemical Industry Co., Ltd.) as a nonionic surfactant, and further dissolved 1.00 g of brown powder of a polyaniline-based conductive polymer obtained in Production Example, and a concentration of the solid content of the polymer was adjusted so as to be 0.20 wt %. After stirring at room temperature for 2 hours, the mixture was filtered through a polyethylene filter subjected to hydrophilic treatment to make it as Comparative Example 6.

Comparative Example 7

In ultrapure water in which 0.067 g of triethyl-amine had been dissolved was dissolved 0.03 g of acetylene glycol-based surfactant SURFYNOL 465 (available from Nisshin Chemical Industry Co., Ltd.) as a nonionic surfactant and 0.90 g of polyvinylpyrrolidone (available from NACALAI TESQUE, INC.) as a water-soluble polymer compound, and further dissolved 1.00 g of brown powder of a polyaniline-based conductive polymer obtained in Production Example, and a concentration of the solid content of the polymer was adjusted so as to be 0.200 wt %. After stirring at room temperature for 2 hours, the mixture was filtered through a polyethylene filter subjected to hydrophilic treatment to make it as Comparative Example 7.

Comparative Example 8

In ultrapure water in which 0.17 g of tetra-n-butylammonium hydroxide had been dissolved was dissolved 0.03 g of acetylene glycol-based surfactant SURFYNOL 465 (available from Nisshin Chemical Industry Co., Ltd.) as a nonionic surfactant and 0.90 g of polyvinylpyrrolidone (available from NACALAI TESQUE, INC.) as a water-soluble polymer compound, and further dissolved 1.00 g of brown powder of a polyaniline-based conductive polymer obtained in Production Example, and a concentration of the solid content of the polymer was adjusted so as to be 0.200 wt %. After stirring at room temperature for 2 hours, the mixture was filtered through a polyethylene filter subjected to hydrophilic treatment to make it as Comparative Example 8.

Comparative Example 9

In ultrapure water in which 0.10 g of diaza-bicycloundecene (DBU) had been dissolved was dissolved 0.03 g of acetylene glycol-based surfactant SURFYNOL 465 (available from Nisshin Chemical Industry Co., Ltd.) as a nonionic surfactant and 0.90 g of polyvinylpyrrolidone (available from NACALAI TESQUE, INC.) as a water-soluble polymer compound, and further dissolved 1.00 g of brown powder of a polyaniline-based conductive polymer obtained in Production Example, and a concentration of the solid content of the polymer was adjusted so as to be 0.200 wt %. After stirring at room temperature for 2 hours, the mixture was filtered through a polyethylene filter subjected to hydrophilic treatment to make it as Comparative Example 9.

(Resist for Evaluation)

In the evaluation as an antistatic film for lithography (for electron beam resist) by the electron beam, as the positive type chemical amplification type resist used in combination, a positive type chemically amplified electron beam resist (RP-1) manufactured by Shin-Etsu Chemical Co., Ltd. was used. In addition, as a negative type chemical amplification type electron beam resist, (RP-2) manufactured by Shin-Etsu Chemical Co., Ltd. was used.

[Positive Type Resist Composition (R-1)]

In an organic solvent were dissolved a polymer (RP-1) (100 parts by mass), an acid generator P-1 (8 parts by mass), Q-1 (4 parts by mass) as an acid diffusion controller and a surfactant, and the obtained respective solutions were filtered through a 0.02 μm-size UPE filter to prepare a positive type resist composition.

[Negative Type Resist Composition (R-2)]

In an organic solvent were dissolved a polymer (RP-2) (100 parts by mass), an acid generator P-1 (5 parts by mass), a fluorine-containing polymer D1 (3 parts by mass), Q-1 (7 parts by mass) as a diffusion controller and a surfactant, and the obtained respective solutions were filtered through a 0.02 μm-size UPE filter to prepare a negative type resist composition.

Also, PF-636 (available from OMNOVA SOLUTIONS Inc.) was added to each resist composition as a surfactant, and as the organic solvent, a mixed solvent of 1,204 parts by mass of propylene glycol monomethyl ether acetate (PGMEA), 1,204 parts by mass of ethyl lactate (EL) and 1,606 parts by mass of propylene glycol monomethyl ether (PGME) was used.

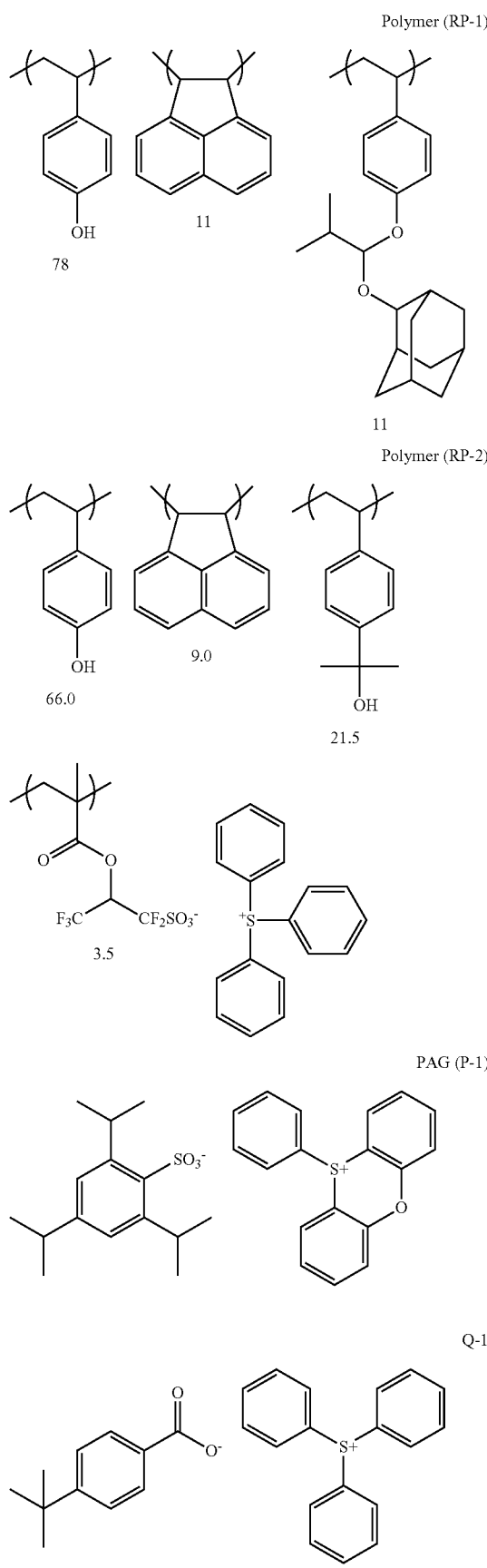

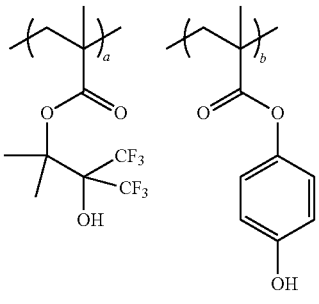

(a = 0.80, b = 0.20, Mw = 6,000)

(Electron Beam Resist and Conductive Polymer Composition Film Formation on Silicon Wafer)

(R-1) and (R-2) were subjected to spin coating on a silicon wafer having a diameter of 6 inches (150 mm) using a coater developer clean track MARK VIII (manufactured by Tokyo Electron Limited), and subjected to baking in a precision thermostat at 110° C. for 240 seconds and the solvent was removed to form a film. On the film, 2.0 mL of each of Examples 1 to 39 and Comparative Examples 1 to 9 was dropped, and subjected to rotation coating on the whole resist film using a spinner. The rotation coating conditions are so adjusted that the film thickness became 80±5 nm. Baking was carried out in a precision thermostat at 90° C. for 5 minutes, and the solvent was removed to obtain an antistatic film. A resist film thickness and an antistatic film thickness were determined by an incident angle-variable spectroscopic ellipsometer VASE (manufactured by J.A. Woollam Co.).

(Conductive Composition Film Formability)

In the film forming process of the above-mentioned electron beam resist and the conductive polymer composition, evaluation was carried out under the criteria that a material in which the conductive polymer composition could be formed with a uniform film on the electron beam resist was made ○, and a material in which measurement of refractive index could be done but a defect derived from particles or partial striation occurred in the film was made ×. The evaluation results are shown in Table 2.

(Washing Peelability)

The formed conductive polymer film was washed away with ion exchanged water in a washing bottle. Evaluation was carried out under the criteria that a material in which the antistatic film was uniformly peeled off within 10 seconds was made ⊚, a material in which the antistatic film was uniformly peeled off 10 seconds or longer and within 20 seconds was made ○. The results are shown in Table 2.

(pH Measurement)

A pH of the conductive polymer compositions of Examples 1 to 39 and Comparative Examples 1 to 9 was each measured by using a pH meter D-52 (manufactured by Horiba Ltd.). The results are shown in Table 2.

(Volume Resistivity)

A volume resistivity (Ω·cm) of the conductive polymer films of Examples 1 to 39 and Comparative Examples 1 to 9 obtained by the above-mentioned film forming method was each measured by using Loresta-GP MCP-T610 or Hiresta-UP MCP-HT450 (each manufactured by Mitsubishi Chemical Corporation). The results are shown in Table 2.

TABLE 2

| | Film formability | Washing peelability | pH | Volume resistivity (Ω · cm) |
|---|---|---|---|---|
| Example 1 | ○ | ○ | 4.76 | 1.21E+02 |
| Example 2 | ○ | ○ | 4.55 | 1.41E+02 |
| Example 3 | ○ | ○ | 4.80 | 1.48E+02 |
| Example 4 | ○ | ○ | 4.77 | 1.10E+02 |
| Example 5 | ○ | ○ | 4.91 | 1.34E+02 |
| Example 6 | ○ | ○ | 4.66 | 1.20E+02 |
| Example 7 | ○ | ○ | 4.77 | 1.11E+02 |
| Example 8 | ○ | ○ | 4.56 | 1.32E+02 |
| Example 9 | ○ | ○ | 4.68 | 1.41E+02 |
| Example 10 | ○ | ○ | 4.99 | 1.01E+02 |
| Example 11 | ○ | ○ | 4.72 | 1.21E+02 |
| Example 12 | ○ | ○ | 4.45 | 1.35E+02 |
| Example 13 | ○ | ○ | 4.87 | 1.54E+02 |
| Example 14 | ○ | ○ | 4.79 | 2.51E+02 |
| Example 15 | ○ | ○ | 4.62 | 2.67E+02 |
| Example 16 | ○ | ○ | 4.77 | 2.88E+02 |
| Example 17 | ○ | ○ | 4.78 | 2.72E+02 |
| Example 18 | ○ | ○ | 4.77 | 2.99E+02 |
| Example 19 | ○ | ○ | 4.76 | 2.89E+02 |
| Example 20 | ○ | ○ | 4.83 | 2.76E+02 |
| Example 21 | ○ | ○ | 4.74 | 2.95E+02 |
| Example 22 | ○ | ○ | 4.80 | 2.82E+02 |
| Example 23 | ○ | ○ | 4.88 | 2.93E+02 |
| Example 24 | ○ | ○ | 4.72 | 2.91E+02 |
| Example 25 | ○ | ○ | 4.63 | 2.89E+02 |
| Example 26 | ○ | ○ | 4.71 | 2.94E+02 |
| Example 27 | ○ | ◎ | 4.98 | 2.72E+03 |
| Example 28 | ○ | ◎ | 5.03 | 3.10E+03 |
| Example 29 | ○ | ◎ | 5.22 | 2.98E+03 |
| Example 30 | ○ | ◎ | 5.31 | 3.32E+03 |
| Example 31 | ○ | ◎ | 5.15 | 3.01E+03 |
| Example 32 | ○ | ◎ | 5.27 | 2.88E+03 |
| Example 33 | ○ | ◎ | 5.11 | 2.67E+03 |
| Example 34 | ○ | ◎ | 4.99 | 3.11E+03 |
| Example 35 | ○ | ◎ | 5.09 | 3.23E+03 |
| Example 36 | ○ | ◎ | 5.32 | 3.29E+03 |
| Example 37 | ○ | ◎ | 5.20 | 3.00E+03 |
| Example 38 | ○ | ◎ | 5.32 | 2.88E+03 |
| Example 39 | ○ | ◎ | 5.20 | 2.72E+03 |
| Comparative Example 1 | ○ | ○ | 6.53 | 2.72E+04 |
| Comparative Example 2 | ○ | ○ | 6.61 | 2.72E+04 |
| Comparative Example 3 | ○ | ○ | 6.97 | 2.72E+04 |
| Comparative Example 4 | ○ | ○ | 6.65 | 8.72E+04 |
| Comparative Example 5 | ○ | ○ | 5.77 | 9.00E+04 |
| Comparative Example 6 | ○ | ○ | 6.71 | 8.92E+04 |
| Comparative Example 7 | ○ | ◎ | 6.90 | 9.01E+04 |
| Comparative Example 8 | ○ | ◎ | 6.12 | 9.20E+04 |
| Comparative Example 9 | ○ | ◎ | 6.28 | 9.21E+04 |

(Evaluation of Change Rate of Film Loss)

The effect of diffusion of the acid from the conductive polymer film to the resist film, or diffusion of the additive to the resist film appears in the film after development when the positive type resist is applied. Hereinafter, Examples 1 to 39 and Comparative Examples 1 to 9 were each formed a film on the positive type resist (R-1), and a change rate of film loss of the resist film was measured when a resist pattern was obtained by development through a peeling process before PEB or a peeling process after PEB of the conductive polymer composition formed into a film after the electron beam writing.

Evaluation of Peeling Process Before PEB (R-1) which is a positive type chemical amplification type resist was subjected to spin coating onto a 6-inches silicon wafer using MARK VIII (manufactured by Tokyo Electron Limited, coater developer clean track), and pre-baked on a hot plate at 110° C. for 240 seconds to prepare a resist film having 80 nm <film thickness (T1)>. The conductive polymer composition was subjected to spin coating onto the obtained wafer attached with a resist film using MARK VIII in the same manner as mentioned above, and baked on a hot plate at 90° C. for 90 seconds to prepare a conductive polymer film having 20 nm. Further, it was exposed using an electron beam exposure apparatus (HL-800D, manufactured by Hitachi High-Technologies Corporation, acceleration voltage 50 keV), thereafter, the conductive polymer film was peeled off by flowing pure water for 15 seconds, and then, baking at 90° C. for 240 seconds (PEB: post exposure bake) was applied and development with an aqueous solution of 2.38% by mass tetramethylammonium hydroxide was carried out to obtain a positive type pattern <film thickness (T3) at unexposed portion>.

Evaluation of Peeling Process After PEB (R-1) which is a positive type chemical amplification type resist was subjected to spin coating onto a 6-inches silicon wafer using MARK VIII (manufactured by Tokyo Electron Limited, coater developer clean track), and pre-baked on a hot plate at 110° C. for 240 seconds to prepare a resist film having 80 nm <film thickness (T1)>. The conductive polymer composition was subjected to spin coating onto the obtained wafer attached with a resist film using MARK VIII in the same manner as mentioned above, and baked on a hot plate at 90° C. for 90 seconds to prepare a conductive polymer film having 20 nm. Further, it was exposed using an electron beam exposure apparatus (HL-800D, manufactured by Hitachi High-Technologies Corporation, acceleration voltage 50 keV), and then, baking at 90° C. for 240 seconds (PEB: post exposure bake) was applied, and development with an aqueous solution of 2.38% by mass tetramethylammonium hydroxide was carried out to obtain a positive type pattern <film thickness (T3) at unexposed portion>.

The same operation as the peeling process after PEB was carried out on the resist film to which no conductive polymer film was provided, and an optimum exposure amount after exposure and development and a resist film thickness (T2) at the unexposed portion were obtained, and according to the following equation, a change rate of film loss (change rate of film thickness) was obtained in each of the peeling process before PEB and the peeling process after PEB of the conductive polymer film.

Change rate of film loss (%)={(T1−T3)−(T1−T2)/(T1−T2)}×100

The results are shown in Table 3.

TABLE 3

| | Change rate of film loss (%) | |
|---|---|---|
| Resist | Peeling process before PEB (R-1) | Peeling process after PEB (R-1) |
| Example 1 | 20.0 | 20.0 |
| Example 2 | 21.2 | 21.2 |
| Example 3 | 18.9 | 18.9 |
| Example 4 | 17.7 | 17.7 |
| Example 5 | 20.7 | 20.7 |
| Example 6 | 18.1 | 18.1 |
| Example 7 | 19.2 | 19.2 |
| Example 8 | 17.6 | 17.6 |
| Example 9 | 18.4 | 18.4 |
| Example 10 | 19.2 | 19.2 |
| Example 11 | 19.8 | 19.8 |

TABLE 3-continued

| | Change rate of film loss (%) | |
|---|---|---|
| Resist | Peeling process before PEB (R-1) | Peeling process after PEB (R-1) |
| Example 12 | 20.1 | 20.1 |
| Example 13 | 18.2 | 18.2 |
| Example 14 | 21.0 | 21.0 |
| Example 15 | 17.7 | 17.7 |
| Example 16 | 21.4 | 21.4 |
| Example 17 | 18.9 | 18.9 |
| Example 18 | 22.2 | 22.2 |
| Example 19 | 23.8 | 23.8 |
| Example 20 | 21.6 | 21.6 |
| Example 21 | 20.2 | 20.2 |
| Example 22 | 23.2 | 23.2 |
| Example 23 | 21.0 | 21.0 |
| Example 24 | 22.3 | 22.3 |
| Example 25 | 19.0 | 19.0 |
| Example 26 | 20.0 | 20.0 |
| Example 27 | 15.7 | 15.7 |
| Example 28 | 15.5 | 15.5 |
| Example 29 | 15.9 | 15.9 |
| Example 30 | 16.6 | 16.6 |
| Example 31 | 17.8 | 17.8 |
| Example 32 | 16.4 | 16.4 |
| Example 33 | 16.0 | 16.0 |
| Example 34 | 16.9 | 16.9 |
| Example 35 | 17.7 | 17.7 |
| Example 36 | 17.2 | 17.2 |
| Example 37 | 16.9 | 16.9 |
| Example 38 | 18.0 | 18.0 |
| Example 39 | 16.1 | 16.1 |
| Comparative Example 1 | 30.6 | 40.1 |
| Comparative Example 2 | 33.6 | 43.4 |
| Comparative Example 3 | 28.9 | 30.4 |
| Comparative Example 4 | 36.5 | 48.4 |
| Comparative Example 5 | 39.6 | 49.9 |
| Comparative Example 6 | 31.1 | 32.2 |
| Comparative Example 7 | 31.3 | 47.9 |
| Comparative Example 8 | 31.5 | 48.5 |
| Comparative Example 9 | 30.9 | 33.3 |

(Evaluation of Electron Beam Writing Resolution)

A resist pattern obtained with the following process by a resist film and conductive film formed on a mask blank was evaluated.

Evaluation of Peeling Process Before PEB

The resist composition prepared as mentioned above was subjected to spin coating onto a mask blank the outermost surface of which is a chromium oxide nitride film with 152 mm square using ACT-M (manufactured by Tokyo Electron Limited), and pre-baked on a hot plate at 110° C. for 600 seconds to prepare a resist film having 80 nm. Measurement of the film thickness of the obtained resist film was carried out by an optical measurement apparatus Nanospec (manufactured by Nanometrics). The measurement was carried out at 81 portions in the plane of the blank substrate excluding the outer periphery portion from the outer edge of the blank to 10 mm inward, and an average value of the film thickness and a range of the film thickness were calculated. The conductive polymer compositions of Examples 1 to 39 and Comparative Examples 1 to 9 were each subjected to spin coating onto the mask blank attached with the resist film thus obtained, and baked on a hot plate at 90° C. for 90 seconds to prepare a conductive polymer film having 20 nm. Subsequently, it was exposed using an electron beam exposure apparatus (EBM-5000plus manufactured by NuFlare Technology Inc., acceleration voltage 50 kV), after peeling by washing with ultrapure water for 20 seconds, subjected to PEB at 110° C. for 600 seconds and developed with an aqueous 2.38% by mass TMAH solution to obtain patterns of a positive type resist (R-1) and negative type resist (R-2).

The obtained resist pattern was evaluated as follows. The prepared mask blank attached with a pattern was observed by a sky SEM (scanning electron microscope), and an exposure amount which resolves 1:1 line-and-space (LS) of 200 nm with 1:1 was made an optimum exposure amount (sensitivity) ($\mu C/cm^2$) and a minimum dimension at an exposure amount which resolves LS of 200 nm with 1:1 was made a resolution (limit resolution), and an edge roughness (LER) of 200 nm LS was measured by SEM. With regard to the pattern shape, whether it was rectangular or not was judged by naked eyes. The results by the positive type resist (R-1) are shown in Table 4, and the results by the negative type resist are shown in Table 5.

TABLE 4

| | Sensitivity ($\mu C/cm^2$) | Limit resolution (nm) | Edge roughness LER | Pattern shape |
|---|---|---|---|---|
| Resist (R-1) alone | 52.5 | 40 | 6.1 | rectangle |
| Example 1 | 52.0 | 40 | 5.4 | rectangle |
| Example 2 | 52.0 | 40 | 5.5 | rectangle |
| Example 3 | 52.8 | 40 | 5.8 | rectangle |
| Example 4 | 52.2 | 40 | 5.5 | rectangle |
| Example 5 | 52.6 | 40 | 5.2 | rectangle |
| Example 6 | 52.9 | 40 | 5.5 | rectangle |
| Example 7 | 52.6 | 40 | 5.4 | rectangle |
| Example 8 | 52.6 | 40 | 5.3 | rectangle |
| Example 9 | 52.1 | 40 | 5.8 | rectangle |
| Example 10 | 52.9 | 40 | 5.3 | rectangle |
| Example 11 | 52.6 | 40 | 5.6 | rectangle |
| Example 12 | 52.9 | 40 | 5.8 | rectangle |
| Example 13 | 52.6 | 40 | 5.3 | rectangle |
| Example 14 | 52.8 | 40 | 5.5 | rectangle |
| Example 15 | 52.5 | 40 | 5.3 | rectangle |
| Example 16 | 52.8 | 40 | 5.5 | rectangle |
| Example 17 | 52.4 | 40 | 5.5 | rectangle |
| Example 18 | 52.8 | 40 | 5.7 | rectangle |
| Example 19 | 52.0 | 40 | 5.7 | rectangle |
| Example 20 | 52.8 | 40 | 5.7 | rectangle |
| Example 21 | 53.0 | 40 | 5.8 | rectangle |
| Example 22 | 52.2 | 40 | 5.2 | rectangle |
| Example 23 | 53.0 | 40 | 5.3 | rectangle |
| Example 24 | 50.8 | 40 | 5.8 | rectangle |
| Example 25 | 52.4 | 40 | 5.4 | rectangle |
| Example 26 | 52.9 | 40 | 5.5 | rectangle |
| Example 27 | 53.0 | 40 | 5.3 | rectangle |
| Example 28 | 52.8 | 40 | 5.8 | rectangle |
| Example 29 | 52.1 | 40 | 5.7 | rectangle |
| Example 30 | 52.4 | 40 | 5.9 | rectangle |
| Example 31 | 52.4 | 40 | 5.4 | rectangle |
| Example 32 | 52.0 | 40 | 5.6 | rectangle |
| Example 33 | 52.2 | 40 | 5.3 | rectangle |
| Example 34 | 52.7 | 40 | 5.8 | rectangle |
| Example 35 | 52.9 | 40 | 5.4 | rectangle |
| Example 36 | 52.4 | 40 | 5.5 | rectangle |
| Example 37 | 52.2 | 40 | 5.9 | rectangle |
| Example 38 | 52.5 | 40 | 5.7 | rectangle |
| Example 39 | 52.6 | 40 | 5.8 | rectangle |
| Comparative Example 1 | 45.8 | 80 | 8.8 | Top rounding |
| Comparative Example 2 | 47.9 | 80 | 8.3 | Top rounding |
| Comparative Example 3 | 58.9 | 150 | 7.9 | T-top |
| Comparative Example 4 | 42.8 | 100 | 9.0 | Top rounding |
| Comparative Example 5 | 43.0 | 100 | 8.2 | Top rounding |
| Comparative Example 6 | 59.0 | 150 | 7.5 | T-top |
| Comparative Example 7 | 45.1 | 100 | 7.2 | Top rounding |

TABLE 4-continued

| | Sensitivity (μC/cm²) | Limit resolution (nm) | Edge roughness LER | Pattern shape |
|---|---|---|---|---|
| Comparative Example 8 | 45.8 | 100 | 6.8 | Top rounding |
| Comparative Example 9 | 58.3 | 150 | 6.5 | T-top |

TABLE 5

| | Sensitivity (μC/cm²) | Limit resolution (nm) | Edge roughness LER | Pattern shape |
|---|---|---|---|---|
| Resist (R-2) alone | 45.0 | 35 | 5.9 | rectangle |
| Example 1 | 44.8 | 35 | 5.3 | rectangle |
| Example 2 | 44.9 | 35 | 5.5 | rectangle |
| Example 3 | 45.2 | 35 | 5.3 | rectangle |
| Example 4 | 45.0 | 35 | 5.8 | rectangle |
| Example 5 | 45.4 | 35 | 5.4 | rectangle |
| Example 6 | 45.2 | 35 | 5.5 | rectangle |
| Example 7 | 44.6 | 35 | 5.2 | rectangle |
| Example 8 | 44.8 | 35 | 5.6 | rectangle |
| Example 9 | 45.3 | 35 | 5.8 | rectangle |
| Example 10 | 45.1 | 35 | 5.3 | rectangle |
| Example 11 | 45.1 | 35 | 5.6 | rectangle |
| Example 12 | 45.5 | 35 | 5.8 | rectangle |
| Example 13 | 45.4 | 35 | 5.3 | rectangle |
| Example 14 | 45.0 | 35 | 5.9 | rectangle |
| Example 15 | 44.7 | 35 | 5.9 | rectangle |
| Example 16 | 45.0 | 35 | 5.8 | rectangle |
| Example 17 | 44.7 | 35 | 5.5 | rectangle |
| Example 18 | 44.8 | 35 | 5.7 | rectangle |
| Example 19 | 45.6 | 35 | 5.5 | rectangle |
| Example 20 | 45.2 | 35 | 5.8 | rectangle |
| Example 21 | 44.9 | 35 | 5.9 | rectangle |
| Example 22 | 45.4 | 35 | 6.0 | rectangle |
| Example 23 | 45.2 | 35 | 5.5 | rectangle |
| Example 24 | 44.7 | 35 | 5.8 | rectangle |
| Example 25 | 44.6 | 35 | 5.9 | rectangle |
| Example 26 | 44.9 | 35 | 5.8 | rectangle |
| Example 27 | 45.0 | 35 | 5.6 | rectangle |
| Example 28 | 45.2 | 35 | 5.8 | rectangle |
| Example 29 | 45.7 | 35 | 5.6 | rectangle |
| Example 30 | 45.2 | 35 | 5.8 | rectangle |
| Example 31 | 45.1 | 35 | 5.5 | rectangle |
| Example 32 | 45.0 | 35 | 5.7 | rectangle |
| Example 33 | 44.7 | 35 | 5.9 | rectangle |
| Example 34 | 45.1 | 35 | 5.8 | rectangle |
| Example 35 | 45.4 | 35 | 5.7 | rectangle |
| Example 36 | 44.7 | 35 | 5.7 | rectangle |
| Example 37 | 45.0 | 35 | 5.8 | rectangle |
| Example 38 | 45.3 | 35 | 5.9 | rectangle |
| Example 39 | 45.2 | 35 | 5.8 | rectangle |
| Comparative Example 1 | 40.3 | 50 | 7.8 | T-top |
| Comparative Example 2 | 40.0 | 50 | 8.3 | T-top |
| Comparative Example 3 | 58.8 | 80 | 7.9 | Top rounding |
| Comparative Example 4 | 38.9 | 55 | 9.2 | T-top |
| Comparative Example 5 | 38.3 | 55 | 8.5 | T-top |
| Comparative Example 6 | 59.8 | 100 | 8.1 | Top rounding |
| Comparative Example 7 | 40.9 | 45 | 7.9 | T-top |
| Comparative Example 8 | 40.5 | 45 | 8.8 | T-top |
| Comparative Example 9 | 58.8 | 80 | 7.5 | Top rounding |

Evaluation of Peeling Process After PEB

The resist composition prepared as mentioned above was subjected to spin coating onto a mask blank the outermost surface of which is a chromium oxide nitride film with 152 mm square using ACT-M (manufactured by Tokyo Electron Limited), and pre-baked on a hot plate at 110° C. for 600 seconds to prepare a resist film having 80 nm. Measurement of the film thickness of the obtained resist film was carried out by an optical measurement apparatus Nanospec (manufactured by Nanometrics). The measurement was carried out at 81 portions in the plane of the blank substrate excluding the outer periphery portion from the outer edge of the blank to 10 mm inward, and an average value of the film thickness and a range of the film thickness were calculated. The conductive polymer compositions of Examples 1 to 39 and Comparative Examples 1 to 9 were each subjected to spin coating onto the wafer attached with the resist film thus obtained, and baked on a hot plate at 90° C. for 90 seconds to prepare a conductive polymer film having 20 nm. Subsequently, it was exposed using an electron beam exposure apparatus (EBM-5000plus manufactured by NuFlare Technology Inc., acceleration voltage 50 kV), subjected to PEB at 110° C. for 600 seconds, and developed with an aqueous 2.38% by mass TMAH solution to obtain patterns of a positive type resist (R-1) and negative type resist (R-2).

The obtained resist pattern was evaluated as follows. The prepared mask blank attached with a pattern was observed by a sky SEM (scanning electron microscope), and an exposure amount which resolves 1:1 line-and-space (LS) of 200 nm with 1:1 was made an optimum exposure amount (sensitivity) (μC/cm²) and a minimum dimension at an exposure amount which resolves LS of 200 nm with 1:1 was made a resolution (limit resolution), and an edge roughness (LER) of 200 nm LS was measured by SEM. With regard to the pattern shape, whether it was rectangular or not was judged by naked eyes. The results by the positive type resist (R-1) are shown in Table 6, and the results by the negative type resist are shown in Table 7.

TABLE 6

| | Sensitivity (μC/cm²) | Limit resolution (nm) | Edge roughness LER | Pattern shape |
|---|---|---|---|---|
| Resist (R-1) alone | 52.8 | 40 | 5.9 | rectangle |
| Example 1 | 52.4 | 40 | 5.5 | rectangle |
| Example 2 | 52.5 | 40 | 5.5 | rectangle |
| Example 3 | 52.6 | 40 | 5.6 | rectangle |
| Example 4 | 52.5 | 40 | 5.5 | rectangle |
| Example 5 | 52.7 | 40 | 5.9 | rectangle |
| Example 6 | 52.9 | 40 | 5.7 | rectangle |
| Example 7 | 52.4 | 40 | 5.5 | rectangle |
| Example 8 | 52.9 | 40 | 5.8 | rectangle |
| Example 9 | 53.1 | 40 | 5.8 | rectangle |
| Example 10 | 52.5 | 40 | 5.9 | rectangle |
| Example 11 | 52.6 | 40 | 5.4 | rectangle |
| Example 12 | 52.3 | 40 | 5.7 | rectangle |
| Example 13 | 52.2 | 40 | 5.7 | rectangle |
| Example 14 | 52.7 | 40 | 5.9 | rectangle |
| Example 15 | 53.1 | 40 | 5.5 | rectangle |
| Example 16 | 52.8 | 40 | 5.7 | rectangle |
| Example 17 | 52.4 | 40 | 5.5 | rectangle |
| Example 18 | 52.8 | 40 | 5.9 | rectangle |
| Example 19 | 52.0 | 40 | 5.8 | rectangle |
| Example 20 | 52.8 | 40 | 5.9 | rectangle |
| Example 21 | 53.0 | 40 | 6.0 | rectangle |
| Example 22 | 52.2 | 40 | 6.2 | rectangle |
| Example 23 | 53.0 | 40 | 5.8 | rectangle |
| Example 24 | 50.8 | 40 | 5.9 | rectangle |
| Example 25 | 52.4 | 40 | 5.4 | rectangle |
| Example 26 | 52.9 | 40 | 5.7 | rectangle |
| Example 27 | 53.0 | 40 | 5.3 | rectangle |
| Example 28 | 52.8 | 40 | 5.8 | rectangle |
| Example 29 | 53.1 | 40 | 5.7 | rectangle |
| Example 30 | 53.0 | 40 | 5.9 | rectangle |
| Example 31 | 52.8 | 40 | 5.5 | rectangle |

TABLE 6-continued

| | Sensitivity (μC/cm²) | Limit resolution (nm) | Edge roughness LER | Pattern shape |
|---|---|---|---|---|
| Example 32 | 52.5 | 40 | 5.6 | rectangle |
| Example 33 | 52.8 | 40 | 5.3 | rectangle |
| Example 34 | 52.6 | 40 | 5.8 | rectangle |
| Example 35 | 52.9 | 40 | 5.7 | rectangle |
| Example 36 | 52.7 | 40 | 5.5 | rectangle |
| Example 37 | 53.0 | 40 | 5.9 | rectangle |
| Example 38 | 52.9 | 40 | 5.7 | rectangle |
| Example 39 | 52.8 | 40 | 5.8 | rectangle |
| Comparative Example 1 | 44.0 | 80 | 8.7 | Top rounding |
| Comparative Example 2 | 43.8 | 80 | 8.8 | Top rounding |
| Comparative Example 3 | 59.2 | 150 | 8.0 | T-top |
| Comparative Example 4 | 41.5 | 100 | 9.3 | Top rounding |
| Comparative Example 5 | 40.9 | 100 | 8.6 | Top rounding |
| Comparative Example 6 | 60.0 | 150 | 7.5 | T-top |
| Comparative Example 7 | 44.1 | 100 | 7.2 | Top rounding |
| Comparative Example 8 | 44.8 | 100 | 7.0 | Top rounding |
| Comparative Example 9 | 58.8 | 150 | 6.8 | T-top |

TABLE 7

| | Sensitivity (μC/cm²) | Limit resolution (nm) | Edge roughness LER | Pattern shape |
|---|---|---|---|---|
| Resist (R-2) alone | 44.0 | 35 | 5.9 | rectangle |
| Example 1 | 44.4 | 35 | 5.3 | rectangle |
| Example 2 | 44.4 | 35 | 5.5 | rectangle |
| Example 3 | 45.0 | 35 | 5.3 | rectangle |
| Example 4 | 44.8 | 35 | 5.8 | rectangle |
| Example 5 | 45.0 | 35 | 5.4 | rectangle |
| Example 6 | 45.2 | 35 | 5.5 | rectangle |
| Example 7 | 44.8 | 35 | 5.2 | rectangle |
| Example 8 | 44.5 | 35 | 5.6 | rectangle |
| Example 9 | 45.2 | 35 | 5.8 | rectangle |
| Example 10 | 45.1 | 35 | 5.3 | rectangle |
| Example 11 | 44.6 | 35 | 5.6 | rectangle |
| Example 12 | 44.5 | 35 | 5.8 | rectangle |
| Example 13 | 45.4 | 35 | 5.3 | rectangle |
| Example 14 | 45.0 | 35 | 5.9 | rectangle |
| Example 15 | 45.7 | 35 | 5.9 | rectangle |
| Example 16 | 45.4 | 35 | 5.8 | rectangle |
| Example 17 | 44.8 | 35 | 5.5 | rectangle |
| Example 18 | 44.9 | 35 | 5.7 | rectangle |
| Example 19 | 45.1 | 35 | 5.5 | rectangle |
| Example 20 | 45.9 | 35 | 5.8 | rectangle |
| Example 21 | 45.0 | 35 | 5.9 | rectangle |
| Example 22 | 45.5 | 35 | 6.0 | rectangle |
| Example 23 | 45.1 | 35 | 5.5 | rectangle |
| Example 24 | 44.9 | 35 | 5.8 | rectangle |
| Example 25 | 45.4 | 35 | 5.9 | rectangle |
| Example 26 | 44.9 | 35 | 5.8 | rectangle |
| Example 27 | 45.5 | 35 | 5.6 | rectangle |
| Example 28 | 45.8 | 35 | 5.8 | rectangle |
| Example 29 | 45.0 | 35 | 5.6 | rectangle |
| Example 30 | 45.5 | 35 | 5.8 | rectangle |
| Example 31 | 44.6 | 35 | 5.5 | rectangle |
| Example 32 | 44.4 | 35 | 5.7 | rectangle |
| Example 33 | 44.7 | 35 | 5.9 | rectangle |
| Example 34 | 45.3 | 35 | 5.8 | rectangle |
| Example 35 | 45.7 | 35 | 5.7 | rectangle |
| Example 36 | 45.2 | 35 | 5.7 | rectangle |
| Example 37 | 45.4 | 35 | 5.8 | rectangle |
| Example 38 | 45.6 | 35 | 5.9 | rectangle |
| Example 39 | 45.3 | 35 | 5.8 | rectangle |
| Comparative Example 1 | 38.8 | 50 | 7.8 | T-top |
| Comparative Example 2 | 39.0 | 50 | 8.3 | T-top |
| Comparative Example 3 | 60.3 | 80 | 7.9 | Top rounding |
| Comparative Example 4 | 37.9 | 55 | 9.2 | T-top |
| Comparative Example 5 | 38.1 | 55 | 8.5 | T-top |
| Comparative Example 6 | 59.6 | 100 | 8.1 | Top rounding |
| Comparative Example 7 | 38.9 | 45 | 7.9 | T-top |
| Comparative Example 8 | 39.5 | 45 | 8.8 | T-top |
| Comparative Example 9 | 56.5 | 80 | 7.5 | Top rounding |

In Table 2, all of Examples 1 to 39 and Comparative Examples 1 to 9 had good spin coat film formability onto the electron beam resist and formed uniform films. On the other hand, with regard to washing peelability, peeling efficiencies of Examples 27 to 39 and Comparative Examples 7 to 9 to which polyvinylpyrrolidone (available from NACALAI TESQUE, INC.) which is (D) a water-soluble polymer had been added gave the highest results. Whereas there appeared no clear difference between Examples and Comparative Examples, with regard to washing peelability, effectiveness of adding (D) a water-soluble polymer was confirmed.

In Examples 1 to 39, the carboxylic acid salt is added as Component (B) to the polyaniline-based polymer compound of Component (A) as the conductive polymer composition, so that the component of (B) causes an ion exchange action to the terminal sulfonic acid of Component (A) whereby the pH becomes a weakly acidic region of 4.5 to 5.3. To the contrary, in Comparative Examples 1 to 9, the component of (B) is a substance showing strong basicity, so that it causes a neutralizing action to the terminal sulfonic acid of Component (A) whereby the pH becomes a higher region to be around neutral. This result is an evaluation of the liquid property before forming a film, so that it is not clear about effectiveness of Examples to Comparative Examples. However, clear difference is generated in lithography by coating these conductive polymer compositions on the electron beam resist to form a film and subjecting to electron beam writing and PEB processes.

Also, in Examples 1 to 39, the volume resistivity (Ω·cm) of the conductive polymer film showed low values which could sufficiently exhibit the antistatic function. However, in Comparative Examples 1 to 9, a substance showing strong basicity was added in place of the carboxylic acid salt of Component (B), so that a side reaction to the resist film occurred and the volume resistivity (Ω·cm) of the conductive polymer film showed a large value and sufficient antistatic function could not be exhibited.

In Table 3, Examples 1 to 39 and Comparative Examples 1 to 9 were each formed a film on the positive type electron beam resist (R-1), and the film loss rate was compared based on the lithography result thorough resist pattern development by way of peeling process before PEB and PEB, or collective resist pattern development after PEB without peeling process before PEB, and in Examples 1 to 39, even when any of the above-mentioned resist species are used or subjected to any of the resist patterning processes, the film loss rate is low as 15 to 25%, but in Comparative Examples 1 to 9, it is extremely large as 30 to 50%. While the component of (B) in Examples 1 to 39 has a little effect of the chemical reaction on the respective constitutional elements of the electron beam resist, the substance showing strong basicity of Comparative Examples 1 to 9 causes not only neutralization of the acid, but also nucleophilic attack to the respective constitutional elements of the electron beam resist and the like, which result modification of the function of the electron beam resist, and the film loss rate after development becomes large.

Also in Tables 4 to 7, Examples 1 to 39 and Comparative Examples 1 to 9 were each formed a film on the positive type electron beam resist (R-1) or the negative type electron beam resist (R-2), and the optimum exposure amount (μC/cm$^2$), resolution (limit resolution), edge roughness (LER) and the pattern shape were compared based on the lithography result thorough resist pattern development by way of peeling process before PEB and PEB, or collective resist pattern development after PEB without peeling process before PEB, and in Examples 1 to 39, even when any of the above-mentioned resist species are used or subjected to any of the resist patterning processes, there is a little change in sensitivity, and both of the limit resolution and the roughness (LER) are equal to lithography of the resist alone to which no conductive polymer composition had been coated, and the pattern shape after development is maintained the rectangular shape (rectangle) without impairing the resist property. On the other hand, in Comparative Examples 1 to 9, as mentioned above, there are remarkable effect by the chemical reaction to the respective constitutional elements of the electron beam resist, the substance showing strong basicity causes not only neutralization of the acid in the conductive polymer composition but also causes nucleophilic attack to the respective constitutional elements of the electron beam resist after film formation and the like, which exerts an effect on the sensitivity of the electron beam resist or the lithographic property, and the resolution, roughness (LER) and pattern shape are deteriorated.

(Evaluation of Electron Beam Lithography and Evaluation of PCD (Post Coating Delay))

Next, change with a lapse of time due to the effect of the conductive polymer film on the resist film before irradiating the electron beam was measured. The two-layered film of the resist film and the conductive polymer film provided by coating according to the following mentioned method was allowed to stand immediately after film formation for 7 days, 14 days and 30 days in the electron beam writing apparatus, and then, a resist pattern was obtained by the peeling process before PEB or the peeling process after PEB of the conductive polymer film as mentioned below. Change in the pattern line width at the sensitivity when the resist and conductive polymer films were drawn immediately after film formation was obtained.

Evaluation of Peeling Process Before PEB

The positive type chemically amplified resist (R-1) was subjected to spin coating on a silicon wafer having a diameter of 6 inches (150 mm) using MARK VIII (manufactured by Tokyo Electron Limited, coater developer clean track), and subjected to pre-baking on a hot plate at 110° C. for 240 seconds to obtain a resist film having a film thickness of 80 nm. The conductive polymer composition was subjected to spin coating onto the obtained wafer attached with the resist film in the same manner as mentioned above using MARK VIII, and baked on a hot plate at 90° C. for 90 seconds to prepare a conductive polymer film. With regard to the wafer onto which the two-layered film of the resist film and the conductive polymer film had been provided by coating, resist patterns were obtained immediately after provided by coating, after 7 days, after 14 days and after 30 days, respectively, by the following methods. First, with regard to the wafer immediately after provided by coating, it was exposed by using an electron beam exposure apparatus (HL-800D, manufactured by Hitachi High-Technologies Corporation, acceleration voltage 50 keV), thereafter, the conductive polymer film was peeled off by flowing pure water for 20 seconds, and then, it was subjected to baking at 110° C. for 240 seconds (PEB: post exposure bake) and developed by an aqueous 2.38% by mass tetramethylammonium hydroxide solution. The prepared wafer attached with a pattern was observed by a sky SEM (scanning electron microscope), and an exposure amount which resolves line-and-space of 400 nm with 1:1 was made an optimum exposure amount (sensitivity) (μC/cm$^2$). A minimum dimension at the optimum exposure amount was made a resolution. In addition, with regard to the wafers that have lapsed for 7 days, 14 days and 30 days after provided by coating, resist patterns were similarly obtained, and change in the pattern line width at the exposure amount (optimum exposure amount (sensitivity) (μC/cm$^2$)) which resolves line-and-space of 200 nm with 1:1 in the wafer immediately after provided by coating was measured. The results are shown in Table 8.

Evaluation of Peeling Process After PEB

In the same manner as in the peeling process before PEB, wafers onto which the two-layered film of the resist film and the conductive polymer film had been provided by coating were prepared, and with regard to the respective wafers that have lapsed for 7 days, 14 days and 30 days after provided by coating, they were subjected to baking at 110° C. for 240 seconds (PEB: post exposure bake) without subjecting to the process of peeling the conductive polymer film by flowing pure water for 20 seconds after the electron beam exposure, and developed by an aqueous 2.38% by mass tetramethylammonium hydroxide solution to obtain a resist pattern. Change in the pattern line width at the exposure amount (optimum exposure amount (sensitivity) (μC/cm$^2$)) which resolves line-and-space of 200 nm with 1:1 in the wafer immediately after provided by coating was measured. The results are shown in Table 9.

With regard to the negative type resist (R-2), the same evaluation as the above-mentioned positive type resist (R-1) was carried out for the peeling process before PEB and the peeling process after PEB. The results are shown in Table 10 and Table 11.

TABLE 8

Positive resist (R-1) peeling process before PEB, PCD

| | PCD line width variation (nm) | | | |
|---|---|---|---|---|
| | Immediately after coating | 7 days | 14 days | 30 days |
| Example 1 | 0 | −0.6 | −1.0 | −1.8 |
| Example 2 | 0 | −0.5 | −0.8 | −1.6 |
| Example 3 | 0 | −0.5 | −0.7 | −1.7 |
| Example 4 | 0 | −0.4 | −0.7 | −1.7 |
| Example 5 | 0 | −0.5 | −0.7 | −1.6 |
| Example 6 | 0 | −0.4 | −0.7 | −1.5 |
| Example 7 | 0 | −0.5 | −0.8 | −1.9 |
| Example 8 | 0 | −0.5 | −0.9 | −1.8 |
| Example 9 | 0 | −0.5 | −0.8 | −2.0 |
| Example 10 | 0 | −0.6 | −0.9 | −1.9 |

TABLE 8-continued

Positive resist (R-1) peeling process before PEB, PCD

PCD line width variation (nm)

|  | Immediately after coating | 7 days | 14 days | 30 days |
|---|---|---|---|---|
| Example 11 | 0 | −0.4 | −0.8 | −1.7 |
| Example 12 | 0 | −0.4 | −0.8 | −1.7 |
| Example 13 | 0 | −0.3 | −0.8 | −1.6 |
| Example 14 | 0 | −0.5 | −0.8 | −1.5 |
| Example 15 | 0 | −0.5 | −0.7 | −1.5 |
| Example 16 | 0 | −0.4 | −0.8 | −1.5 |
| Example 17 | 0 | −0.5 | −0.9 | −1.8 |
| Example 18 | 0 | −0.5 | −0.8 | −1.8 |
| Example 19 | 0 | −0.5 | −0.7 | −1.9 |
| Example 20 | 0 | −0.5 | −0.8 | −1.6 |
| Example 21 | 0 | −0.3 | −0.8 | −1.7 |
| Example 22 | 0 | −0.5 | −1.0 | −2.0 |
| Example 23 | 0 | −0.5 | −0.8 | −1.9 |
| Example 24 | 0 | −0.5 | −0.9 | −1.5 |
| Example 25 | 0 | −0.4 | −0.8 | −1.7 |
| Example 26 | 0 | −0.5 | −1.0 | −1.8 |
| Example 27 | 0 | −0.4 | −0.8 | −1.6 |
| Example 28 | 0 | −0.3 | −0.6 | −1.5 |
| Example 29 | 0 | −0.4 | −0.8 | −1.5 |
| Example 30 | 0 | −0.5 | −0.9 | −1.5 |
| Example 31 | 0 | −0.5 | −0.8 | −1.9 |
| Example 32 | 0 | −0.4 | −0.8 | −1.7 |
| Example 33 | 0 | −0.3 | −0.6 | −1.5 |
| Example 34 | 0 | −0.5 | −0.9 | −1.5 |
| Example 35 | 0 | −0.4 | −0.8 | −1.5 |
| Example 36 | 0 | −0.4 | −0.8 | −1.5 |
| Example 37 | 0 | −0.5 | −1.0 | −1.9 |
| Example 38 | 0 | −0.4 | −0.8 | −1.8 |
| Example 39 | 0 | −0.3 | −0.7 | −1.5 |
| Comparative Example 1 | 0 | −5.5 | −10.0 | −19.0 |
| Comparative Example 2 | 0 | −5.8 | −11.2 | −17.8 |
| Comparative Example 3 | 0 | −2.1 | −4.3 | −9.6 |
| Comparative Example 4 | 0 | −6.0 | −11.7 | −19.7 |
| Comparative Example 5 | 0 | −5.8 | −12.4 | −20.0 |
| Comparative Example 6 | 0 | −3.1 | −5.8 | −10.5 |
| Comparative Example 7 | 0 | −5.1 | −9.6 | −20.2 |
| Comparative Example 8 | 0 | −5.5 | −9.5 | −18.5 |
| Comparative Example 9 | 0 | −2.0 | −5.1 | −12.6 |

TABLE 9

Positive resist (R-1) peeling process after PEB, PCD

PCD line width variation (nm)

|  | Immediately after coating | 7 days | 14 days | 30 days |
|---|---|---|---|---|
| Example 1 | 0 | −0.6 | −1.0 | −1.8 |
| Example 2 | 0 | −0.6 | −0.8 | −1.6 |
| Example 3 | 0 | −0.5 | −0.7 | −1.7 |
| Example 4 | 0 | −0.5 | −0.7 | −1.7 |
| Example 5 | 0 | −0.7 | −0.7 | −1.6 |
| Example 6 | 0 | −0.6 | −0.7 | −1.5 |
| Example 7 | 0 | −0.5 | −0.8 | −1.9 |
| Example 8 | 0 | −0.5 | −0.9 | −1.8 |
| Example 9 | 0 | −0.6 | −0.8 | −2.0 |
| Example 10 | 0 | −0.6 | −0.9 | −1.9 |
| Example 11 | 0 | −0.5 | −0.8 | −1.7 |
| Example 12 | 0 | −0.6 | −0.8 | −1.7 |
| Example 13 | 0 | −0.5 | −0.8 | −1.6 |
| Example 14 | 0 | −0.6 | −0.8 | −1.5 |
| Example 15 | 0 | −0.7 | −0.7 | −1.5 |
| Example 16 | 0 | −0.5 | −0.8 | −1.5 |
| Example 17 | 0 | −0.5 | −0.9 | −1.8 |
| Example 18 | 0 | −0.5 | −0.8 | −1.8 |
| Example 19 | 0 | −0.5 | −0.7 | −1.9 |
| Example 20 | 0 | −0.5 | −0.8 | −1.6 |
| Example 21 | 0 | −0.3 | −0.8 | −1.7 |
| Example 22 | 0 | −0.5 | −1.0 | −2.0 |
| Example 23 | 0 | −0.5 | −0.8 | −1.9 |
| Example 24 | 0 | −0.6 | −0.9 | −1.5 |
| Example 25 | 0 | −0.4 | −0.8 | −1.7 |
| Example 26 | 0 | −0.5 | −1.0 | −1.8 |
| Example 27 | 0 | −0.5 | −0.8 | −1.6 |
| Example 28 | 0 | −0.4 | −0.6 | −1.5 |
| Example 29 | 0 | −0.5 | −0.8 | −1.5 |
| Example 30 | 0 | −0.6 | −0.9 | −1.5 |
| Example 31 | 0 | −0.5 | −0.8 | −1.9 |
| Example 32 | 0 | −0.4 | −0.8 | −1.7 |
| Example 33 | 0 | −0.3 | −0.6 | −1.5 |
| Example 34 | 0 | −0.5 | −0.9 | −1.5 |
| Example 35 | 0 | −0.4 | −0.8 | −1.5 |
| Example 36 | 0 | −0.5 | −0.8 | −1.5 |
| Example 37 | 0 | −0.5 | −1.0 | −1.9 |
| Example 38 | 0 | −0.5 | −0.8 | −1.8 |
| Example 39 | 0 | −0.5 | −0.7 | −1.5 |
| Comparative Example 1 | 0 | −6.8 | −10.0 | −20.0 |
| Comparative Example 2 | 0 | −7.0 | −11.2 | −19.6 |
| Comparative Example 3 | 0 | −3.1 | −5.1 | −8.8 |
| Comparative Example 4 | 0 | −7.3 | −14.3 | −21.4 |
| Comparative Example 5 | 0 | −6.7 | −14.9 | −22.2 |
| Comparative Example 6 | 0 | −4.0 | −5.3 | −10.2 |
| Comparative Example 7 | 0 | −6.9 | −11.7 | −23.3 |
| Comparative Example 8 | 0 | −7.5 | −12.8 | −20.7 |
| Comparative Example 9 | 0 | −2.5 | −5.4 | −12.8 |

TABLE 10

Negative resist (R-2) peeling process before PEB, PCD

PCD line width variation (nm)

|  | Immediately after coating | 7 days | 14 days | 30 days |
|---|---|---|---|---|
| Example 1 | 0 | 0.7 | 1.0 | 1.7 |
| Example 2 | 0 | 0.7 | 0.9 | 1.9 |
| Example 3 | 0 | 0.6 | 0.8 | 1.8 |
| Example 4 | 0 | 0.7 | 0.7 | 1.7 |
| Example 5 | 0 | 0.6 | 0.9 | 1.9 |
| Example 6 | 0 | 0.6 | 0.8 | 2.0 |
| Example 7 | 0 | 0.7 | 1.0 | 1.8 |
| Example 8 | 0 | 0.5 | 0.8 | 1.8 |
| Example 9 | 0 | 0.6 | 0.9 | 1.8 |
| Example 10 | 0 | 0.6 | 0.9 | 2.0 |
| Example 11 | 0 | 0.6 | 0.8 | 1.8 |
| Example 12 | 0 | 0.5 | 0.8 | 1.7 |
| Example 13 | 0 | 0.6 | 0.8 | 1.8 |
| Example 14 | 0 | 0.6 | 0.8 | 1.9 |
| Example 15 | 0 | 0.6 | 0.7 | 2.0 |
| Example 16 | 0 | 0.6 | 0.8 | 1.6 |

TABLE 10-continued

Negative resist (R-2) peeling process before PEB, PCD

PCD line width variation (nm)

|  | Immediately after coating | 7 days | 14 days | 30 days |
|---|---|---|---|---|
| Example 17 | 0 | 0.7 | 0.9 | 2.0 |
| Example 18 | 0 | 0.7 | 0.8 | 2.0 |
| Example 19 | 0 | 0.5 | 0.7 | 1.9 |
| Example 20 | 0 | 0.6 | 0.8 | 1.7 |
| Example 21 | 0 | 0.3 | 0.8 | 1.9 |
| Example 22 | 0 | 0.5 | 1.0 | 1.8 |
| Example 23 | 0 | 0.7 | 0.8 | 1.9 |
| Example 24 | 0 | 0.5 | 0.9 | 1.9 |
| Example 25 | 0 | 0.6 | 0.8 | 1.6 |
| Example 26 | 0 | 0.5 | 1.0 | 2.0 |
| Example 27 | 0 | 0.5 | 0.8 | 1.8 |
| Example 28 | 0 | 0.4 | 0.6 | 1.7 |
| Example 29 | 0 | 0.4 | 0.8 | 1.6 |
| Example 30 | 0 | 0.4 | 0.9 | 1.7 |
| Example 31 | 0 | 0.6 | 0.7 | 1.8 |
| Example 32 | 0 | 0.5 | 0.9 | 1.9 |
| Example 33 | 0 | 0.5 | 0.8 | 1.6 |
| Example 34 | 0 | 0.4 | 1.0 | 1.6 |
| Example 35 | 0 | 0.5 | 0.8 | 1.5 |
| Example 36 | 0 | 0.6 | 0.8 | 1.7 |
| Example 37 | 0 | 0.4 | 0.9 | 1.6 |
| Example 38 | 0 | 0.6 | 0.8 | 1.9 |
| Example 39 | 0 | 0.5 | 0.8 | 1.8 |
| Comparative Example 1 | 0 | 5.8 | 12.5 | 22.1 |
| Comparative Example 2 | 0 | 6.1 | 12.9 | 23.2 |
| Comparative Example 3 | 0 | 3.1 | 6.5 | 10.0 |
| Comparative Example 4 | 0 | 7.4 | 13.4 | 22.5 |
| Comparative Example 5 | 0 | 5.9 | 14.9 | 23.4 |
| Comparative Example 6 | 0 | 4.5 | 6.2 | 15.8 |
| Comparative Example 7 | 0 | 6.5 | 11.6 | 24.1 |
| Comparative Example 8 | 0 | 6.8 | 12.8 | 22.2 |
| Comparative Example 9 | 0 | 3.2 | 8.0 | 14.0 |

TABLE 11

Negative resist (R-2) peeling process after PEB, PCD

PCD line width variation (nm)

|  | Immediately after coating | 7 days | 14 days | 30 days |
|---|---|---|---|---|
| Example 1 | 0 | 0.8 | 1.0 | 1.9 |
| Example 2 | 0 | 0.7 | 0.9 | 1.9 |
| Example 3 | 0 | 0.6 | 0.8 | 1.8 |
| Example 4 | 0 | 0.7 | 0.7 | 1.7 |
| Example 5 | 0 | 0.6 | 0.9 | 1.9 |
| Example 6 | 0 | 0.6 | 0.8 | 2.0 |
| Example 7 | 0 | 0.7 | 0.9 | 1.9 |
| Example 8 | 0 | 0.6 | 0.8 | 1.8 |
| Example 9 | 0 | 0.6 | 0.8 | 2.0 |
| Example 10 | 0 | 0.7 | 0.9 | 1.9 |
| Example 11 | 0 | 0.6 | 0.8 | 1.8 |
| Example 12 | 0 | 0.7 | 0.7 | 1.7 |
| Example 13 | 0 | 0.6 | 0.9 | 1.9 |
| Example 14 | 0 | 0.6 | 0.8 | 2.0 |
| Example 15 | 0 | 0.7 | 0.9 | 1.9 |
| Example 16 | 0 | 0.6 | 0.8 | 1.8 |
| Example 17 | 0 | 0.5 | 0.8 | 1.7 |
| Example 18 | 0 | 0.7 | 0.9 | 1.7 |
| Example 19 | 0 | 0.5 | 0.7 | 1.9 |
| Example 20 | 0 | 0.7 | 0.7 | 1.7 |
| Example 21 | 0 | 0.5 | 0.7 | 1.9 |
| Example 22 | 0 | 0.6 | 0.8 | 1.7 |
| Example 23 | 0 | 0.7 | 0.8 | 1.9 |
| Example 24 | 0 | 0.6 | 0.8 | 1.8 |
| Example 25 | 0 | 0.7 | 0.9 | 1.7 |
| Example 26 | 0 | 0.5 | 0.7 | 1.9 |
| Example 27 | 0 | 0.5 | 0.9 | 1.8 |
| Example 28 | 0 | 0.4 | 0.6 | 1.7 |
| Example 29 | 0 | 0.5 | 0.8 | 1.6 |
| Example 30 | 0 | 0.5 | 1.0 | 1.7 |
| Example 31 | 0 | 0.8 | 1.1 | 1.8 |
| Example 32 | 0 | 0.6 | 1.0 | 1.9 |
| Example 33 | 0 | 0.9 | 1.1 | 2.0 |
| Example 34 | 0 | 0.6 | 1.0 | 1.6 |
| Example 35 | 0 | 0.7 | 0.8 | 1.5 |
| Example 36 | 0 | 0.8 | 0.9 | 1.7 |
| Example 37 | 0 | 0.6 | 0.9 | 1.6 |
| Example 38 | 0 | 0.7 | 0.8 | 1.9 |
| Example 39 | 0 | 0.7 | 0.8 | 1.8 |
| Comparative Example 1 | 0 | 6.6 | 12.8 | 22.8 |
| Comparative Example 2 | 0 | 6.6 | 13.8 | 24.8 |
| Comparative Example 3 | 0 | 3.0 | 7.3 | 11.1 |
| Comparative Example 4 | 0 | 8.7 | 15.0 | 24.0 |
| Comparative Example 5 | 0 | 7.9 | 16.1 | 24.2 |
| Comparative Example 6 | 0 | 5.4 | 7.5 | 17.4 |
| Comparative Example 7 | 0 | 7.2 | 12.6 | 25.8 |
| Comparative Example 8 | 0 | 6.9 | 13.9 | 24.3 |
| Comparative Example 9 | 0 | 3.3 | 8.5 | 14.6 |

As shown in Tables 8 to 11, in the evaluation of the PCD (Post Coating Delay), in the compositions of Examples 1 to 39 having the effect of suppressing influence of the acid from the conductive polymer film to the electron beam resist layer, storage stability of the resist film could be maintained good even after forming the films as the conductive film on the resist upper layer. That is, this suggests that, in a covered material of the resist film and the conductive polymer film (antistatic film) thereon before the electron beam writing, in the processes of the writing and peeling of the conductive polymer film (antistatic film), and pattern development, good lithographic result can be obtained by suppressing diffusion of the acid from the conductive polymer film. On the other hand, the compositions of Comparative Examples 1 to 9 have high relaxing (neutralization) efficiency of the acidity of the composition and show liquid property near to neutral by adding a strongly basic substance to the composition, but after film formation, these strongly basic substance causes side reactions such as nucleophilic attack to the constitutional elements of the electron beam resist and reduction in amplification efficiency of the generated acid after writing and the like, diffusion of the excessive acid in the resist film and local excessive acid quencher are generated to exert bad effects on lithography. This effect is remarkable as the time of being formed a film on the upper layer of the resist layer is longer, and even in the peeling process before PEB, the effect is large.

As described above, when the conductive polymer composition of the present invention is employed, an antistatic film having excellent antistatic property at the time of writing to the electron beam resist and minimizing the effect of the acid to the resist as little as possible can be formed. The composition having such conductivity and capable of preventing the effect of the acid is also effective as a constitutional film of an organic thin film device, and if it suppresses the effect of the acid to the adjacent layer and acts functions such as conductivity and carrier transfer medium and the like in the laminated structure, it can be also suitably used as a device constituting material.

It must be stated here that the present invention is not restricted to the embodiments shown by Examples. The embodiments shown by Examples are merely examples so that any embodiments composed of substantially the same technical concept as disclosed in the claims of the present invention and expressing a similar effect are included in the technical scope of the present invention.

The invention claimed is:

1. A conductive polymer composition comprising:
   (A) a polyaniline-based conductive polymer having at least one kind or more of a repeating unit represented by the following general formula (1):

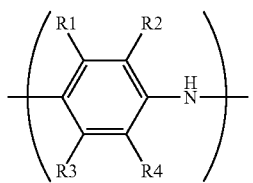

wherein, R1 to R4 each independently represent a hydrogen atom, an acidic group, a hydroxyl group, a nitro group, a halogen atom, a linear or branched alkyl group having 1 to 24 carbon atoms, a linear, branched or cyclic hydrocarbon group having 1 to 24 carbon atoms containing a hetero atom, or a linear, branched or cyclic hydrocarbon group having 1 to 24 carbon atoms partially substituted with a halogen atom,
   (B) a carboxylic acid salt represented by the following general formula (2):

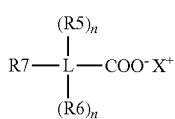

wherein:
   L represents a single bond or a linear, branched or cyclic saturated or unsaturated hydrocarbon chain having 1 to 8 carbon atoms in which a hetero atom may be interposed, when L is a single bond, then n=0 and when L is not a single bond, then n=1;
   R5 and R6 each independently represent a hydrogen atom, a hetero atom, a —COO$^-$X$^+$ group, a hydroxyl group, a linear, branched or cyclic monovalent hydrocarbon group having 1 to 20 carbon atoms in which a hetero atom may be interposed, or a linear, branched or cyclic saturated or unsaturated hydrocarbon group having 1 to 8 carbon atoms having a —COO$^-$X$^+$ group at the end thereof;
   R7 represents a hydrogen atom, a hydroxyl group or a —COO$^-$X$^+$ group; and
   X$^+$ represents a lithium ion, a sodium ion, a potassium ion or a nitrogen compound represented by the following general formula (3):

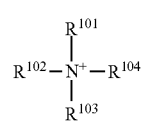

wherein, $R^{101}$, $R^{102}$, $R^{103}$ and $R^{104}$ each independently represent a hydrogen atom, a linear, branched or cyclic alkyl group, an alkenyl group, an oxoalkyl group or an oxoalkenyl group each having 1 to 12 carbon atoms, an aryl group having 6 to 20 carbon atoms, or an aralkyl group or an aryloxoalkyl group each having 7 to 12 carbon atoms, and a part or whole of the hydrogen atoms of these groups may be substituted by an alkoxy group; $R^{101}$ and $R^{102}$, or $R^{101}$, $R^{102}$ and $R^{104}$ may form a ring, and when a ring is formed, $R^{101}$ and $R^{102}$, and $R^{101}$, $R^{102}$ and $R^{104}$ each represent an alkylene group having 3 to 10 carbon atoms or a heteroaromatic ring having the nitrogen atom in the formula in the ring, and
   (D) a water-soluble polymer,
      wherein a content of the Component (B) is 1 part by mass to 70 parts by mass based on 100 parts by mass of the Component (A).

2. The conductive polymer composition according to claim 1, wherein the acidic group is a sulfo group.

3. The conductive polymer composition according to claim 1, wherein the conductive polymer composition further comprises (C) a nonionic surfactant.

4. The conductive polymer composition according to claim 2, wherein the conductive polymer composition further comprises (C) a nonionic surfactant.

5. The conductive polymer composition according to claim 3, wherein a content of the Component (C) is 0.1 part by mass to 10 parts by mass based on 100 parts by mass of the Component (A).

6. The conductive polymer composition according to claim 4, wherein a content of the Component (C) is 0.1 part by mass to 10 parts by mass based on 100 parts by mass of the Component (A).

7. The conductive polymer composition according to claim 1, wherein a content of the Component (D) is 30 parts by mass to 150 parts by mass based on 100 parts by mass of the Component (A).

8. A coated product which comprises a film of the conductive polymer composition according to claim 1 being formed onto a material to be processed.

9. The coated product according to claim 8, wherein the material to be processed is a substrate provided with a chemical amplification type resist film.

10. The coated product according to claim 9, wherein the material to be processed is a substrate provided with a chemical amplification type electron beam resist film having a sensitivity of 20 µC/cm$^2$ or more.

11. A patterning process which comprises forming an antistatic film using the conductive polymer composition according to claim 1 onto a resist film of a substrate provided with a chemical amplification type resist film, pattern irradiating an electron beam, and developing it using $H_2O$ or an alkaline developer to obtain a resist pattern.

\* \* \* \* \*